US009625118B2

(12) United States Patent
Kim

(10) Patent No.: US 9,625,118 B2
(45) Date of Patent: Apr. 18, 2017

(54) OPTICAL LENS, LIGHT EMITTING DEVICE, AND LIGHTING DEVICE HAVING THE SAME

(71) Applicant: LG INNOTEK CO., LTD., Seoul (KR)

(72) Inventor: Kwang Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/953,055

(22) Filed: Nov. 27, 2015

(65) Prior Publication Data

US 2016/0076732 A1 Mar. 17, 2016

Related U.S. Application Data

(63) Continuation of application No. 13/960,203, filed on Aug. 6, 2013, now Pat. No. 9,236,543.

(30) Foreign Application Priority Data

Aug. 30, 2012 (KR) .................. 10-2012-0095895

(51) Int. Cl.
*F21V 5/04* (2006.01)
*H01L 33/54* (2010.01)
(Continued)

(52) U.S. Cl.
CPC ............ *F21V 5/046* (2013.01); *F21V 7/0008* (2013.01); *F21V 7/0091* (2013.01);
(Continued)

(58) Field of Classification Search
CPC ......... H01L 33/60; H01L 33/58; H01L 33/54; H01L 2924/1301; H01L 2224/48091; H01L 2224/48247; H01L 2224/8592; G02B 19/0061; G02B 19/0028; F21V 7/0091
See application file for complete search history.

(56) References Cited

U.S. PATENT DOCUMENTS

2006/0208269 A1 9/2006 Kim et al.
2007/0001185 A1* 1/2007 Lu .................. G02F 1/133603
257/98
(Continued)

FOREIGN PATENT DOCUMENTS

DE 10 2005 019 832 A1 9/2006
EP 2 378 338 A1 10/2011
(Continued)

OTHER PUBLICATIONS

Japanese Office Action dated Jun. 9, 2014 issued in Application No. 2013-157242.
(Continued)

*Primary Examiner* — Joshua King
*Assistant Examiner* — Mohammed R Alam
(74) *Attorney, Agent, or Firm* — Ked & Associates, LLP

(57) ABSTRACT

Disclosed is an optical lens. The optical lens includes a bottom surface having a recess part at center thereof; a light exit surface provided in opposite to the bottom surface and having a convex curved surface; an outer sidewall connected between the bottom surface and the light exit surface; a recess portion recessed toward the bottom surface; and a convex portion provided between the recess portion and the light exit surface. The recess part is convexly recessed in a direction of the recess portion. The recess portion includes a first to third total-reflection surface having curvatures different from each other. The convex portion is protruded inwardly from an inflection point between the convex portion and the light exit surface.

20 Claims, 23 Drawing Sheets

(51) Int. Cl.
  *H01L 33/58* (2010.01)
  *H01L 33/60* (2010.01)
  *G02B 19/00* (2006.01)
  *F21V 7/00* (2006.01)
  *G02B 17/08* (2006.01)
  *H01L 33/46* (2010.01)

(52) U.S. Cl.
  CPC ....... *G02B 17/086* (2013.01); *G02B 19/0028* (2013.01); *G02B 19/0061* (2013.01); *H01L 33/54* (2013.01); *H01L 33/58* (2013.01); *H01L 33/60* (2013.01); *H01L 33/46* (2013.01); *H01L 2224/48091* (2013.01); *H01L 2224/48247* (2013.01); *H01L 2224/8592* (2013.01); *H01L 2924/1301* (2013.01); *H01L 2924/181* (2013.01)

(56) References Cited

U.S. PATENT DOCUMENTS

| | | |
|---|---|---|
| 2007/0217195 A1 | 9/2007 | Chen et al. |
| 2008/0074888 A1 | 3/2008 | Chang |
| 2008/0128725 A1 | 6/2008 | Hsing et al. |
| 2008/0297918 A1* | 12/2008 | Park .................... G02B 3/08 359/709 |
| 2011/0157898 A1* | 6/2011 | Kanai .................. F21V 5/04 362/296.05 |
| 2011/0249451 A1 | 10/2011 | Fujii et al. |

FOREIGN PATENT DOCUMENTS

| | | |
|---|---|---|
| JP | 2008-512706 A | 4/2008 |
| WO | WO 2011/055467 A1 | 5/2011 |

OTHER PUBLICATIONS

Japanese Final Rejection dated Oct. 15, 2014 issued in Application No. 2013-157242.

U.S. Office Action dated Mar. 18, 2015 issued in U.S. Appl. No. 13/960,203.

Notice of Allowance dated Aug. 28, 2015 issued in U.S. Appl. No. 13/960,203.

European Search Report dated Nov. 3, 2015 issued in Application No. 13178139.5.

* cited by examiner

OPTICAL LENS, LIGHT EMITTING DEVICE, AND LIGHTING DEVICE HAVING THE SAME

CROSS-REFERENCE TO RELATED APPLICATIONS

This application is a Continuation of co-pending U.S. patent application Ser. No. 13/960,203 filed on Aug. 6, 2013, which claims priority under 35 U.S.C. §119(a) of Korean Patent Application No. 10-2012-0095895 filed on Aug. 30, 2012, which is hereby incorporated by reference in its entirety.

BACKGROUND

The embodiment relates to an optical lens, a light emitting device, and a lighting device having the same.

A light emitting device, for example, a light emitting diode is a kind of a semiconductor device to convert electrical energy into light. The light emitting device has been spotlighted as a next-generation light source to substitute for a fluorescent lamp and an incandescent bulb according to the related art.

Since the light emitting diode generates light using the semiconductor device, the light emitting diode requires only significantly low power consumption when comparing with the incandescent bulb to generate light by heating tungsten (W) or the fluorescent lamp to generate light by allowing UV (ultraviolet) light, which is generated through a high-intensity discharge lamp, to collide with a fluorescent body.

In addition, since the light emitting diode generates light by using the potential gap of the semiconductor device, the light emitting diode represents a longer life span, a rapid response characteristic, and an eco-friendly property as compared with those of existing light sources Accordingly, many studies and researches to substitute the existing light sources with the light emitting diode have been carried out. In addition, the light emitting diodes are increasingly used as light sources of a variety of lamps used in indoor and outdoor places and lighting devices such as liquid crystal displays, electronic display boards, and streetlamps.

SUMMARY

The embodiment provides an optical lens capable of diffusing incident light and a light emitting device having the same.

The embodiment provides an optical lens including convex portions disposed at a peripheral part of a recess portion that is recessed in the direction of an incident surface from an apex of an exit surface and protruding with an inflection point.

The embodiment provides an optical lens including a reflective member disposed in a recess portion, which is recessed in the direction of an incident surface from an apex of an exit surface, and a convex portion protruding with an inflection point at a peripheral part of the recess portion.

The embodiment provides an optical lens including a convex portion having a convex curvature between an apex of an exit surface and an adjacent inflection point provided inward of the apex.

The embodiment provides an optical lens including a convex portion convexly with an apex between a recess portion, which is recessed in the incident direction of light, and an exit surface.

The embodiment provides an optical lens including a convex portion, which is disposed between a recess portion recessed in the incident direction of light and an exit surface, and has a curvature smaller than a curvature of the recess portion, and a light emitting device having the same.

The embodiment provides an optical lens including a convex portion at a peripheral part of a recess portion recessed in the incident direction of light and a reflective member on the recess portion, and a light emitting device having the same.

The embodiment provides an optical lens having a diffusing part recessed in the exit direction of light, at an incident part.

The embodiment provides a light emitting device with a phosphor layer at a light incidence side of an optical lens.

An embodiment provides a light emitting device including a light emitting chip, and an optical lens on the light emitting chip. The optical lens includes an incident surface into which a light emitted from the light emitting chip is incident, a recess portion opposite to the incident surface and recessed in a direction of the incident surface, an exit surface at a peripheral portion of the recess portion to output a light incident through the incident surface, and a convex portion protruding between the recess portion and the exit surface and connected with at least one of the recess portion and the exit surface through an inflection point. The convex portion is located inward of a line segment ranging from the light emitting chip to a first inflection point provided at an outermost portion of the recess portion.

DETAILED DESCRIPTION OF THE EMBODIMENTS

Figure 1:
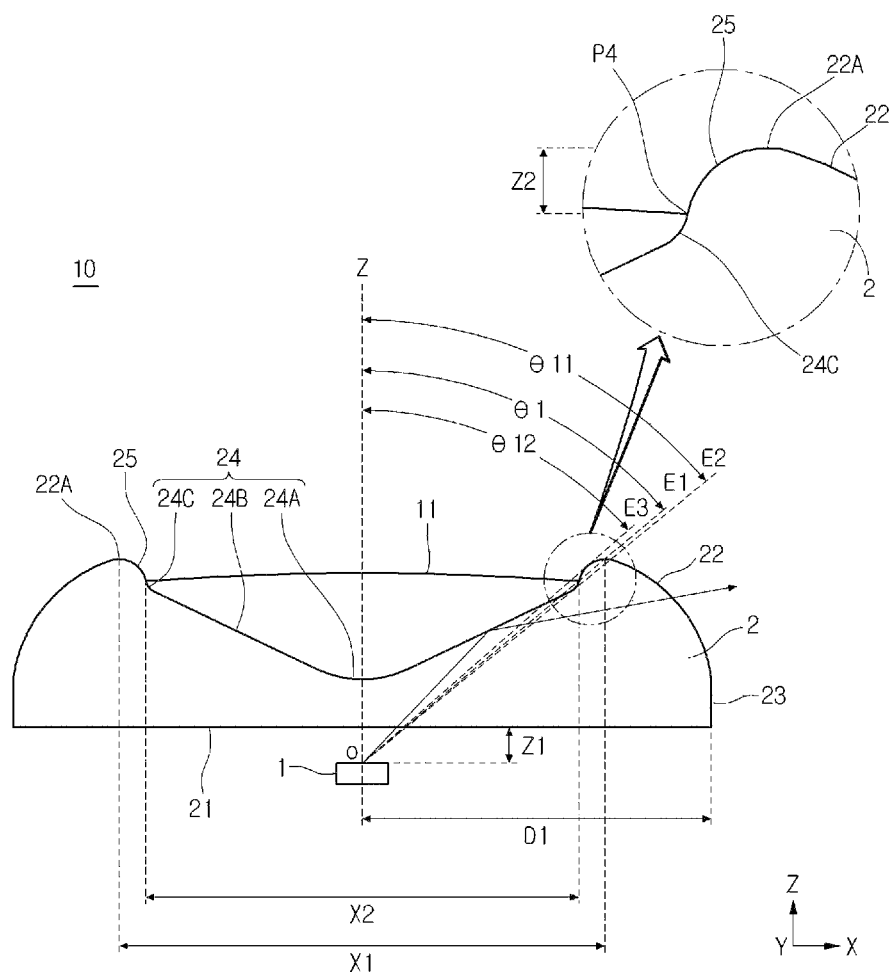
FIG. 1 is a side sectional view showing a light emitting device according to the first embodiment.

Hereinafter, the embodiments will be apparently understood to those skilled in the art based on accompanying drawings and the description of the embodiments. In the description of the embodiments, it will be understood that, when a layer (film), a region, a pattern, or a structure is referred to as being "on" a substrate, another layer (film), another region, or another structure, it can be "directly" or "indirectly" on the other substrate, the other layer (film), the other region, or the other structure, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings. Hereinafter, a light emitting device according to the embodiments will be described with reference to accompanying drawings.

FIG. 1 is a side sectional view showing a light emitting device according to the first embodiment.

Referring to FIG. 1, the light emitting device 10 includes a light emitting chip 1, an optical lens 2 to diffuse the light emitted from the light emitting chip 1 and output the light through an exit surface 22, and a reflective member 11 on the optical lens 2. The reflective member 11 may be included in the optical lens 2 or may be provided separately from the optical lens 2, but the embodiment is not limited thereto.

The light emitting chip 1 serves a light source and selectively emits light in the range of an ultraviolet wavelength to a visible wavelength. The light emitting chip 1 includes an UV LED chip, a green LED chip, a blue LED chip, a red LED chip, or a white LED chip. Phosphors may be applied to a light exit region of the light emitting chip 1, but the embodiment is not limited thereto.

The light emitting chip 1 may be located at lower position than the bottom surface (e.g., incident surface) of the optical lens 2, make contact with a portion of the bottom surface of the optical lens 2, or located in a recessed region of the optical lens 2. According to the embodiment, the light emitting chip 1 may be spaced apart from a light incident surface 21 of the optical lens 2 by a predetermined distance Z1. The distance Z1 may have the value of zero, or 0.01 mm or more. In this case, the central portion of the light emitting chip 1 may be disposed concentrically with respect to the center of the optical lens 2.

The direction of an optical axis (reference optical axis) Z refers to a light travelling direction on the center of the three-dimensional light flux emitted from the light emitting chip 1. As shown in FIG. 1, for the explanation convenience, a vertical direction upward from the light emitting chip 1 may be defined as the optical axis Z (reference optical axis) or a normal line. In addition, the light emitting device 10 has one rotational symmetry shape about the optical axis Z. In addition, it is unnecessary for the light emitting chip 1 to essentially have the rotational symmetry shape. In detail, the light emitting chip 1 may have a polyhedral shape. The optical lens 2 changes the direction of the light L output from the light emitting chip 1. In other words, the optical lens 2 diffuses the light L by reflecting light incident to the optical axis Z and to a region incident to the optical axis Z.

The optical lens 2 is a member to output light around the optical axis Z. The optical lens 2 serves as a light extraction lens or a lateral-direction light extraction lens. The optical lens 2 is a member to change the direction of light emitted from the light emitting chip 1. Although the optical lens 2 includes various materials, the optical lens 2 may preferably include a transparent material having the refractive index of 1.4 to 1.7. In more preferably, the optical lens 2 may include a transparent resin material such as poly methacrylic acid methyl (PMMA) having the refractive index of 1.49, polycarbonate having the refractive index of 1.59, and epoxy resin (EP), or a transparent glass.

The optical lens 2 includes an incident surface 21 serving as a bottom surface, light exit regions 22 and 23, and a recess portion 24. The incident surface 21 perpendicularly crosses the optical axis Z.

The lengths of the optical lens 2 perpendicular to each other may be equal to each other or different from each other when viewed from the incident surface 21. For instance, the length of the optical lens 2 in a longitudinal direction may be equal to or different from the length of the optical lens 2 in a transverse direction when viewed from the incident surface 21, but the embodiment is not limited thereto.

The light exit regions 22 and 23 include an exit surface 22 and an outer sidewall 23. The section of the exit surface 22 is formed in the shape of a convex surface having a contour with a predetermined curvature. The exit surface 22 diffuses light incident into the optical lens 2 and outputs almost all light. The outer sidewall 23 connects the exit surface 22 with the incident surface 21. The outer sidewall 23 may be perpendicularly bent from the incident surface 21 or may be connected with the incident surface 21 while representing a curved surface. The outer sidewall 23 may be substantially parallel to the optical axis Z. According to another embodiment, the section of the outer sidewall 23 may be formed in the shape of a convex surface with a predetermined curvature, but the embodiment is not limited thereto. The outer sidewall 23 may serve as a surface through which light is output.

The recess portion 24 is provided in opposite side to the incident surface 21, and recessed toward the incident surface 21 around the optical axis Z while representing a concave shape. The recess portion 24 may have a rotational symmetry shape about the optical axis Z. According to another embodiment, the recess portion 24 may have a non-rotational symmetry shape.

The recess portion 24 may have at least two total-reflection surfaces when the contour of a concave surface is divided based on an inflection point. The section of each total-reflection surface may be inclined or curved, but the embodiment is not limited thereto.

The side section of the recess portion 24 may have the shape recessed toward the light emitting chip 1 about the optical axis Z. For instance, the recess portion 24 may have a cup shape or a vessel shape. In this case, the recess portion 24 has the same center as that of the optical axis Z. The depth of the recess portion 24 is gradually increased toward the optical axis Z. For example, the recess portion 24 has the lowest depth at the center thereof. The recess portion 24 has the smallest thickness between the center thereof and the incident surface 21.

The recess portion 24 has total-reflection surfaces which are provided from the optical axis Z toward an apex 22A of the optical lens 2 and have curvatures different from each other or slops different from each other. The total-reflection surfaces reflect incident light. For example, the recess portion 24 may include a first total-reflection surface 24A, a second total-reflection surface 24B, and a third total-reflection surface 24C. The center of the first total-reflection surface 24A is located on the optical axis Z, and the first total-reflection surface 24A has a concave curved surface having a predetermined curvature. The second total-reflection surface 24B may be an inclined surface having a predetermined internal angle about the optical axis Z or a curved surface. The second total-reflection surface is connected between the first and second total-reflection surfaces 24A and 24C. The third total-reflection surface 24C is connected with the second total-reflection surface 24B, and located closer to the apex 22A of the exit surface 22 than the optical axis Z. The section of the exit surface 22 is formed in the shape of a concave surface having a contour with a predetermined curvature. Direction changing points among the first, second, and third total-reflection surfaces 24A, 24B, and 24C may be inflection points, but the embodiment is not limited thereto. In this case, the inflection point may be a point at which a concave curvature is changed to a convex curvature, or the convex curvature is changed into the concave curvature.

The recess portion 24 may have a circular rim or an oval rim when viewed from the top, but the embodiment is not limited thereto. The recess portion 24 may have a sink structure or a recess structure.

The optical lens 2 includes a convex portion 25 interposed between the recess portion 24 and the exit surface 22. The convex portion 25 is connected between the recess portion 24 and the exit surface 22. The convex portion 25 may have a protruding structure from at least one of the surfaces of the recess portion 24 and the exit surface 22, or a dam structure. The convex portion 25 may be an inflected region. The convex portion 25 may have a rotational symmetry shape about the optical axis Z.

The sectional shape of the convex portion 25 includes a curved surface having a convex curvature opposite to the curvature of the third total-reflection surface 24C. The convex portion 25 includes a convex curved surface connected between the apex 22A and a first inflection point P4 which is provided closest to the convex portion 25 from the apex 22A toward the recess portion 24. The first inflection point P4 is the outermost inflection point of the recess portion 24, or the lowest inflection point of the convex portion 25. In other words, the first inflection point P4 may be the outermost point when viewed from the recess portion 24, or may be the lowest point located closest to the recess portion 24 when viewed from the convex portion 25. The first inflection point P4 becomes a boundary point between the recess portion 24 and the convex portion 25.

The apex 22A of the exit surface 22 may be the apex of the convex portion 25 or may be the apex of the optical lens 2. At least one of side-sectional surfaces of the first to third total-reflection surfaces 24A, 24B, and 24C may include a spherical surface and/or an aspheric surface, but the embodiment is not limited thereto. In addition, the side section of the convex portion 25 may have a spherical surface and/or an aspheric surface.

The exit surface 22 may extend in a curved shape and/or with a predetermined slope outward of the convex portion 25, and refracts the reflected light.

In this case, when the light emitting chip 1 is employed as a reference point O, an angle θ1 between a first virtual segment E1, which passes through both of the reference point O and the first inflection point 25A, and the optical axis Z may be in the range of 40° to 60°.

An angle θ11 between a second virtual segment E2, which serves as a tangential line making contact with the outer curved surface of the recess portion 24 while starting from the reference point O, and the optical axis Z is greater than the angle θ1. For example, the angle θ11 may be in the range of 41° to 75°.

An angle θ12 formed between a third vertical segment E3, which serves as a tangential line making contact with the innermost curved surface of the convex portion 25 while starting from the reference point O, and the optical axis Z may at an angle equal to or smaller than the angle θ1. The angle θ12 may be formed in the range of 35° to 65°.

The convex portion 25 is provided along a peripheral part of the recess portion 24, and connected between the first inflection point P4 and the apex 22A. The diameter of the convex portion 25 is shorter than a first diameter X1 serving as the distance between apexes 22A, and longer than a second diameter X2 serving as the distance between first inflection points P4. In other words, the distance between convex portions 25 is in the range of the first diameter X1 and the second diameter X. The first diameter X1 may be the diameter between the apexes 22A or the maximum diameter of the convex portion 25. The second diameter X2 may be the maximum diameter of the recess portion 24 or the diameter between first inflection points P4.

Since the convex portion 25 is provided inward of the second virtual segment E2 passing the outermost portion of the recess portion 24 from the reference point O, the convex portion 25 hardly exerts an influence on the light emitted from the light emitting chip 1. In other words, since the convex portion 25 is actually provided at a region to which the light emitted from the light emitting chip 1 is not directly incident, the convex portion 25 may not exert an influence on the distribution of the light orientation angle. Accordingly, the convex portion 25 may improve the product yield of the optical lens 2.

The convex portion 25 is provided thereon with the reflective member 11. The reflective member 11 directly makes contact with the surface of the recess portion 24. The reflective member 11 may include the mixture of resin material and at least one of metallic oxide and metallic nitride. According to the embodiment, the reflective member 11 includes the mixture of resin material and metallic oxide for the explanation. The resin material includes a material such as silicon or epoxy. In addition, the resin material may include polyacrylate resin, epoxy resin, phenolic resin, polyamides resin, polyimides rein, unsaturated polyesters resin, polyphenylene ether resin (PPE), polyphenilene oxide resin (PPO), polyphenylenesulfides resin, cyanate ester resin, benzocyclobutene (BCB), Polyamido-amine Dendrimers (PAMAM), Polypropylene-imine, Dendrimers (PPI), or PAMAM-OS (organosilicon) having a PAMAM internal structure and an organic-silicon outer surface in a single form, or may resin including the combination thereof.

The reflective member 11 may serve as a high-refraction layer or a reflective layer having a refractive index higher than that of the optical lens 2. In addition, the reflective member 11 may include a layer representing the light reflectance efficiency of 70% or more, for example, 85% or more, but the embodiment is not limited thereto. The reflective member 11 and the optical lens 2 may make the difference of 0.1 or more, in detail, 0.3 or more in the refractive index.

The metallic oxide may have the content of 10 wt % or more, in detail, the content of 30 wt % to 80 wt % in the reflective member 11. The metallic oxide may include at least one of $TiO_2$, $SiO_2$, and $Al_2O_3$ representing a refractive index higher than that of the optical lens 2. Accordingly, the reflective member 11 may have the refractive index higher than that of the optical lens 2. For example, the reflective member 11 may have the refractive index of 1.7 or more. The reflective member 11 may include a ceramic material such as $SiO_2$, $Si_xO_y$, $Si_3N_4$, $Si_xN_y$, $SiO_xN_y$, $Al_2O_3$, BN, $Si_3N_4$, SiC (SiC—BeO), BeO, CeO, or AlN.

The top surface or the high point of the reflective member 11 may be dosposed in the form of a convex surface toward the optical axis Z, a concave surface toward the light emitting chip 1, or a flat surface, but the embodiment is not limited thereto.

The convex portion 25 protrudes in the shape of a convex having a surface that is rapidly curved from the apex 22A of the optical lens 2. Accordingly, a point of the top surface of the reflective member 11 making contact with the optical lens 2 is interposed between the first inflection point P4 and the apex 22A.

The reflective member 11 may make contact with the surface of the convex portion 25, and may have a diameter equal to or shorter than that of the convex portion 25.

The convex portion 25 may guide the level of the reflective member 11 when the reflective member 11 is formed, and may prevent the reflective member 11 from being provided upward from the convex portion 25. Therefore, the convex portion 25 may prevent the reflective member 11 from being formed on an unnecessary surface, so that the optical lens 2 may have the desirable distribution of light orientation angles.

Figure 2:
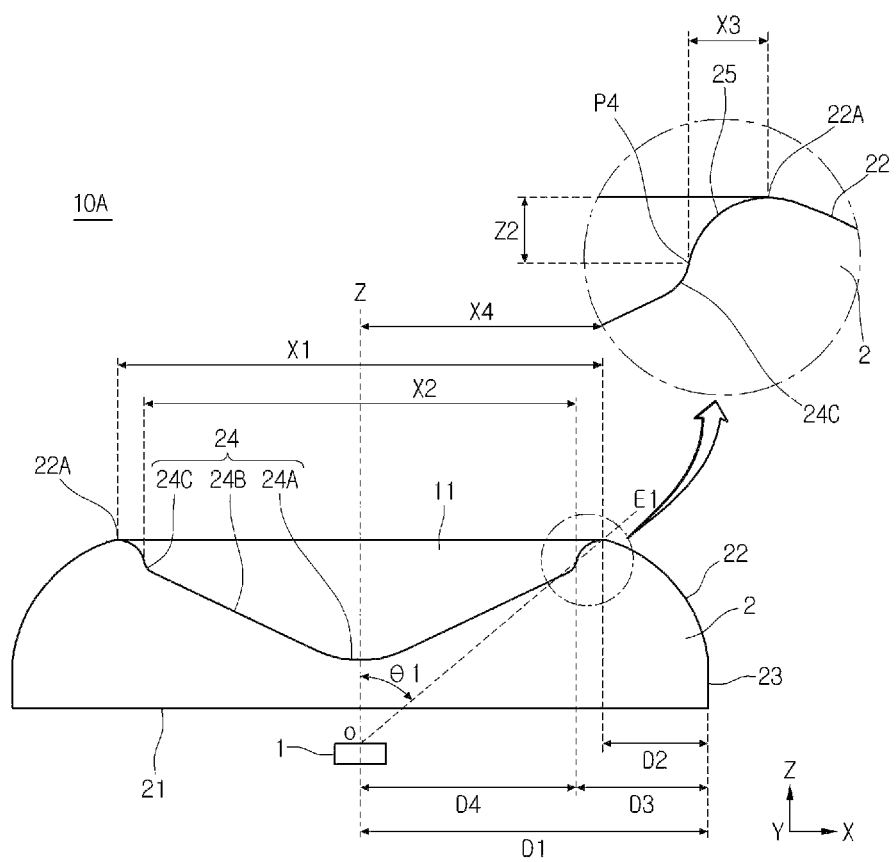
FIG. 2 is a side sectional view showing a light emitting device according to the second embodiment.
Figure 3:
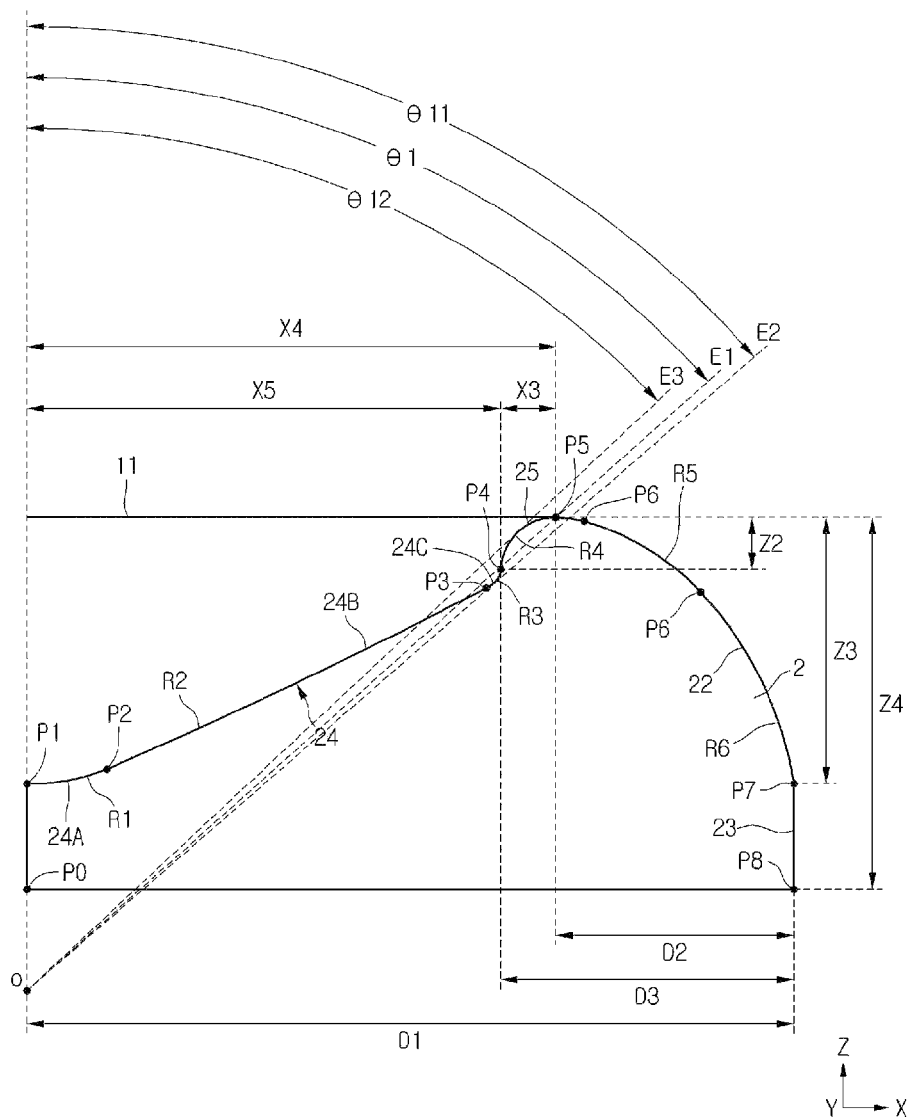
FIG. 3 is a partial enlarged view showing an optical lens of FIG. 2.

FIG. 2 is a side sectional view showing a light emitting device according to a second embodiment. FIG. 3 is a partial enlarged view of an optical lens shown in FIG. 2.

Referring to FIGS. 2 and 3, a light emitting device 10A includes a light emitting chip 1, an optical lens 2, and a reflective member 11.

A reflective member 11 is disposed on a recess portion 24 of the optical lens 2. A point of the top surface of the reflective member 11 making contact with the optical lens 2 may include an apex 22A of the optical lens 2 or the inner region of a convex portion 25. In this case, when the light emitting chip 1 is employed as a reference point O, an angle θ1 between a first virtual segment E1, which passes through the first inflection point 25A while staring from the reference point O, and the optical axis Z may be in the range of 40° to 60°. An angle θ11 between a second virtual segment E2, which serves as a tangential line making contact with the outermost curved surface of the recess portion 24 while starting from the reference point O, and the optical axis Z is greater than the angle θ1. For example, the angle θ11 may be in the range of 41° to 75°. An angle θ12 between a third vertical segment E3, which serves as a tangential line making contact with the innermost curved surface of the convex portion 25 while starting from the reference point O, and the optical axis Z may at an angle equal to or smaller than the angle θ1. The angle θ12 may be formed in the range of 35° to 65°.

The convex portion 25 may be formed in the shape of a ring interposed between the first inflection point P4 and the apex 22A. In other words, the convex portion 25 may be formed in the shape of a dam around the recess portion 24. The diameter of the convex portion 25 is shorter than a diameter X1 between apexes 22A of the optical lens 2 and longer than a diameter X2 of the first inflection point P4.

Since the convex portion 25 is provided inward of the second virtual segment E2 passing the outermost portion of the recess portion 24 from the reference point O, the convex portion 25 hardly exerts an influence on the light emitted from the light emitting chip 1. In other words, since the convex portion 25 is actually provided at a region to which the light emitted from the light emitting chip 1 is not directly incident, the convex portion 25 may not exert an influence on the distribution of the light orientation angle. Accordingly, the convex portion 25 may improve the product yield of the optical lens 2.

When viewed from the top, the optical lens 2 has a circular shape, and a radius D1 of the optical lens 2 is in the range of 2.50±0.5 mm, but the embodiment is not limited thereto. A distance X5 between the optical axis Z and the first inflection point P4 may be formed in the range of 59% to 65% of the distance D1. In detail, the distance X5 may be formed in the range of 1.50±0.5 mm.

A distance X4 between the optical axis Z and the apex 22A of the exit surface 22 corresponds to ½ of the diameter between the apexes 22A, and is longer than the distance X5. The distance X4 may be formed in the range of 65% to 71% of the radius D1. For example, the distance X4 may be formed in the range of 1.70±0.5 mm. The segment perpendicular to the first inflection point P4 is spaced apart from the outermost portion of the optical lens 2 by a predetermined distance D3. The distance D3 may be formed in the range of 39% to 45% of the distance D1. For example, the distance D3 may be in the range of 0.8 mm to 1.2 mm. In addition, the segment perpendicular to the apex 22A of the exit surface 22 may be spaced apart from the outermost portion of the optical lens 2 by a predetermined distance D2. The distance D2 may be shorter than the distance D3, and may be in the range of 50% to 80% of the distance X4. For example, the distance D2 may be in the range of 0.68 mm to 0.75 mm.

The convex portion 25 is provided inward of the tangential line passing the third total-reflection surface 24C of the recess portion 24 between the first inflection point P4 and the apex 22A of the exit surface 22.

The distance X3 between the apex 22A of the exit surface 22 and the segment perpendicular to the first inflection point P4 serves as the width of the convex portion 25, and may be in the range of 0.15 mm to 0.19 mm. A distance Z2 of the apex 22A of the exit surface 22 and a segment parallel to the first inflection point P4 serves as the height of the convex portion 25, and may be in the range of 0.15 mm to 0.19 mm. The convex portion 25 is provided inward of the apex 22A of the optical lens 2 to serve as the outer boundary of the reflective member 11, thereby effectively preventing the reflective member 11 from being positioned beyond the convex portion 25.

Referring to FIG. 3, when comparing with the maximum thickness Z4 of the optical lens 2, a depth Z3 of the recess portion 24 may be formed in the range of 65% to 75% of the thickness Z4. The maximum thickness Z4 may be formed in the range of 50% to 60% of the distance D1, which is shorter than the distance D1. The thickness (Z4-Z3) at the central portion of the optical lens 2 is the distance between the points P1 and P0, and may be in the range of 25% to 35% of the maximum thickness Z4.

In addition, the recess portion 24 of the optical lens 2 has total-reflection surfaces having different curvatures outward of the optical axis Z to reflect incident light. The recess portion 24 may have a rotational symmetry shape about the optical axis Z, but the embodiment is not limited thereto.

The optical lens 2 may extend from the recess portion 24 to the exit surface 22 while representing inflection points. The first total-reflection surface 24A of the recess portion 24 is a region between a low point P1 of the first total-reflection surface 24A and a change point to the second total-reflection surface 24B, and may be connected with the second total-reflection surface 24B through an inflection point P2. The curvature R1 of the first total-reflection surface 24A may be smaller than the curvature R2 of the second total-reflection surface 24B and greater than the curvature R3 of the third total-reflection surface 24C. For example, the curvature R1 may be in the range of 1 mm to 2 mm.

The curvature R2 of the second total-reflection surface 24B is a curvature of the recess portion 24 between the inflection points P2 and P3 adjacent to each other, and may be larger than the curvatures R1 and R3 of the first and third total-reflection surfaces 24A and 24C. In detail, the curvature R2 of the second total-reflection surface 24B may be in the range of 14 mm to 20 mm.

The curvature R3 of the third total-reflection surface 24C is the curvature of a curved surface connecting the inflection points P3 and P4 adjacent to each other. The curvature R3 of the third total-reflection surface 24C may be smaller than the curvatures R1 and R2 of the first and second total-reflection surfaces 24A and 24B and the curvature R4 of the convex portion 25. In detail, the curvature R3 of the third total-reflection surface 24C may be in the range of 0.05 mm to 0.12 mm. The curvatures R1 and R3 of the first and third total-reflection surfaces 24A and 24C are curvatures of curved surfaces concaved toward the optical axis Z. The curvatures R2 and R4 of the second total-reflection surface 24B and the convex portion 25 are curvatures of the curved surfaces convex toward the optical axis Z. The curvature R4 of the first total-reflection surface (the convex portion 25) may be formed in the range of 0.15 mm to 0.25 mm.

The curvature R4 of the convex portion 25 is at least two times smaller than the curvature R1 of the first total-reflection surface 24A. The curvature R4 of the convex portion 25 is smaller than the curvatures R1 and R2 of the first and second total-reflection surfaces 24A and 24B.

Since the third total-reflection surface 24C and the convex portion 25 have surfaces curved in opposite direction to each other about the first inflection point P4 and curvatures R3 and R4 different from each other, the convex portion 25 may have a rapidly-curved surface. In other words, the curvature R4 of the convex portion 25 is smaller than the curvature of the recess portion 24 or the curvature of the third total-reflection surface 24C.

The exit surface 22 may have a plurality of inflection points P6 and P7 interposed between the inflection point P5 connected with the convex portion 25 and the outer sidewall 23. The inflection point P5 may be an apex, but the embodiment is not limited thereto. The exit surface 22 may be formed in the structure in which the convex curvatures R5 and R6 are formed outward of the optical axis Z. The curvatures R5 and R6 may be different from each other, but the embodiment is not limited thereto.

The outer sidewall 23 may be connected between the inflection point P7 and a low point P8, and may be formed in the shape of a linear contour. The position of the inflection point P7 between the exit surface 22 and the outer sidewall 23 may be higher than the position of the low point P1 of the recess portion 24 based on a horizontal segment, but the embodiment is not limited thereto.

As shown in FIGS. 1 and 2, a portion of the convex portion 25 is higher than a top surface of the reflective member 11, and provided at the boundary region between the recess portion 24 and the exit surface 22. The width of the top surface of the reflective member 11 may be narrower than the distance (or diameter) between the apexes 22A of the optical lens 2, and wider than the distance (or diameter) between the first inflection points P4. In addition, the peripheral part of the top surface of the reflective member 11, which serves as a contact point with the optical lens 2, may be lower than the apex 22A of the optical lens 2, and may be higher than the first inflection point P4. In addition, a portion of the top surface of the reflective member 11 may protrude higher than the apex 22A of the optical lens 2, but the embodiment is not limited thereto. The contact point between the top surface of the reflective member 11 and the optical lens 2 is positioned higher than the segment E1.

According to the embodiment, the convex portion 25 convex in the direction of the optical axis Z may be formed between the recess portion 24 having a plurality of total-reflection surfaces 24A to 24C and the exit surface 22 to prevent the reflective member 11, which is filled in the recess portion 24, from being provided beyond the recess portion 24. Therefore, the peripheral boundary of the reflective member 11 can be defined, and the reflective member 11 can be prevented from exerting an influence on the surface of the light exit regions 22 and 23. Accordingly, the reliability for the distribution of the light orientation angles of the optical lens 2 can be improved, so that the product yield can be improved.

Figure 4:
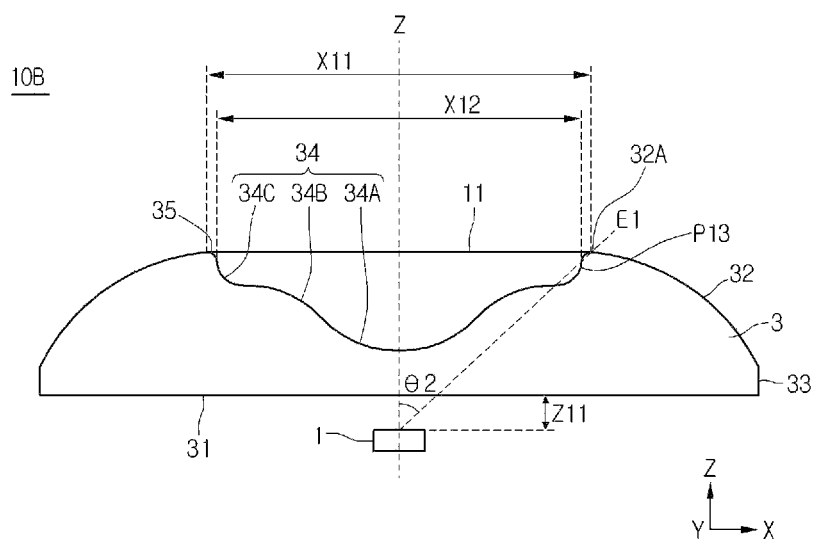
FIG. 4 is a side sectional view showing a light emitting device according to the third embodiment.
Figure 5:
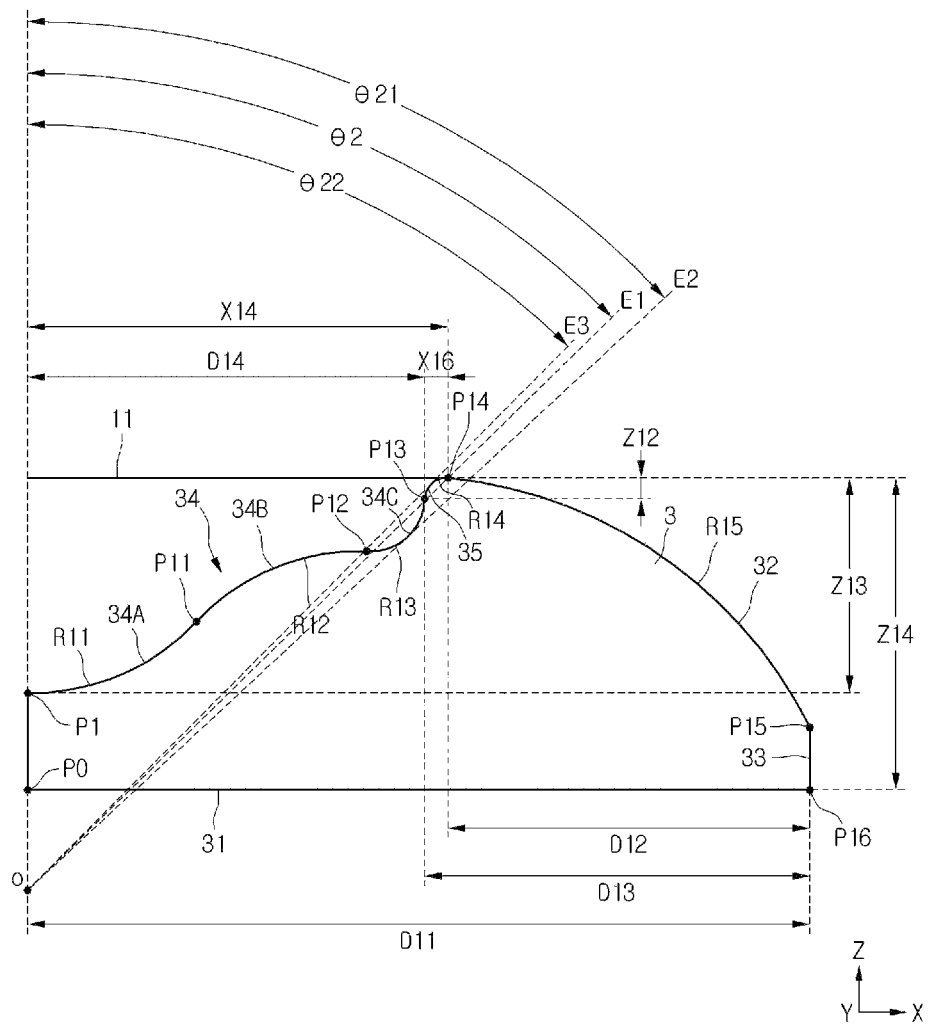
FIG. 5 is a partial enlarged view showing an optical lens of FIG. 4.

FIG. 4 is a side sectional view showing a light emitting device according to the third embodiment, and FIG. 5 is a partial enlarged view of the light emitting device of FIG. 4.

Referring to FIGS. 4 and 5, a light emitting device 10B includes a light emitting chip 1, an optical lens 3 on the light emitting chip 1, and a reflective member 11 on the optical lens 3.

The light emitting chip 1 may be spaced apart from an incident surface 31 of the optical lens 3 by a predetermined distance Z11. The distance Z11 may be 0.01 mm or more, but the embodiment is not limited thereto. In this case, the central portion of the light emitting chip 1 may be provided concentrically with respect to the center of the optical lens 3

The optical lens 3 includes the incident surface 31, an exit surface 32, an outer surface 33, a recess portion 34, and a convex portion 35. The incident surface 31 may include a flat surface or a flat surface, which is partially grooved, but the embodiment is not limited thereto. The light exit region includes the exit surface 32 and the outer surface 33. The exit surface 32 may be convex outward of the optical axis Z, and the outer surface 33 may have a curved surface or a flat surface having the contour of a vertical line.

The recess portion 34 includes a first total-reflection surface 34A, a second total-reflection surface 34B, and a third total-reflection surface 34C. The first total-reflection surface 34A has the same center as that of the optical axis Z, and has the concave shape toward the light emitting chip 1. The recess portion 34 may have a rotational symmetry shape about the optical axis Z, but the embodiment is not limited thereto. The first total-reflection surface 34A may have a hemispherical shape. The second total-reflection surface 34B is provided in the direction opposite to those of the first and third total-reflection surfaces 34A and 34C, and has a curved surface that is convex with respect to the optical axis Z. The third total-reflection surface 34C has a curved surface that is concave.

The convex portion 35 has a curved surface that is convex in the direction of the optical axis Z between the first inflection point P13 and an apex 32A.

The convex portion 35 is connected between the third total-reflection surface 34C and the exit surfaces 32 and 33. The convex portion 35 is positioned inward of the apex 32A of the exit surfaces 32 and 33. In other words, the convex portion 35 is provided closer to the optical axis Z than the first exit surface 32. The section of the convex portion 35 has a curved surface that is convex in the direction of the optical axis Z.

In this case, when the light emitting chip 1 is employed as a reference point O, an angle θ2 between the first virtual segment E1, which passes through both of the reference point O and the first inflection point P13, and the optical axis Z may be in the range of 40° to 60°.

An angle θ21 between a second virtual segment E2, which serves as a tangential line making contact with the outermost curved surface of the recess portion 34 while starting from the reference point O, and the optical axis Z is greater than the angle θ2. For example, the angle θ11 may be in the range of 41° to 75°.

An angle θ22 between a third vertical segment E3, which serves as a tangential line making contact with the innermost curved surface of the convex portion 35 while passing through the reference point O, and the optical axis Z may at an angle equal to or smaller than the angle θ2. The angle θ22 may be formed in the range of 35° to 65°.

Since the convex portion 35 is connected between the first inflection point P13 and the apex 32A, the diameter of the convex portion 35 is shorter than a first diameter X11 between apexes 32A of the optical lens 3, and longer than a second diameter X12 between the first inflection points P13. The convex portion 35 is provided between the first diameter X11 and the second diameter X12.

Since the convex portion 35 is disposed inward of the second virtual segment E2 passing the outermost portion of the recess portion 34 from the reference point O, the convex portion 35 hardly exerts an influence on the light emitted from the light emitting chip 1. In other words, since the convex portion 35 is actually provided at a region to which the light emitted from the light emitting chip 1 is not directly incident, the convex portion 35 may not exert an influence on the distribution of the light orientation angle. Accordingly, the convex portion 35 may improve the product yield of the optical lens 3.

When viewed from the top, the optical lens 3 has a circular shape, and a radius D11 of the optical lens 3 is in the range of 2.50±0.5 mm, but the embodiment is not limited thereto. The convex portion 35 may have a ring shape, and the ring shape may have a continuous dam structure.

A distance D14 between the optical axis Z and the first inflection point P13 may be formed in the range of 50% to 55% of the radius D11. For example, the distance D14 may be in the range of 1.27±0.5 mm.

A distance X14 between the optical axis Z and an apex P14 of the exit surface 32 is longer than the distance D14, and may be in the range of 52% to 57% of the radius D11. For example, the distance X14 may be in the range of 1.3±0.5 mm. The segment perpendicular to the first inflection point P13 is spaced apart from the outermost portion of the optical lens 2 by a predetermined distance D13. The distance D13 may be formed in the range of 45% to 50% of the radius D11. The segment perpendicular to the apex 32A of the exit surface 32 is spaced apart from the outermost portion of the optical lens 3 by a predetermined distance D12. The distance D12 may be shorter than the distance D13, and may be in the range of 43% to 48% of the radius D11.

The convex portion 35 is provided more inward of the tangential line E2 making contact with the third total-reflection surface 24C of the recess portion 34 while being interposed between the first inflection point P14 and the exit surface 32.

A distance X16 between the apex 32A of the exit surface 32 and a segment perpendicular to the first inflection point P13 is the width of the convex portion 35. The distance X16 may be in the range of 0.05 mm to 0.11 mm. A distance Z12 between the apex 32A of the exit surface 32 and a segment horizontal to the first inflection point P13 is the height of the convex portion 35. The distance Z12 may be formed in the range of 0.05 mm to 0.11 mm. The convex portion 35 is provided inward of the apex 32A of the optical lens 3 to serve as an outer boundary of the reflective member 11, thereby effectively preventing the reflective member 11 from being positioned beyond the convex portion 35.

Referring to FIG. 5, a thickness Z14 of the optical lens 3 may be formed in the range of 1 mm±0.2 mm, and a depth Z13 of the recess portion 34 may be formed in the range of 65% to 75% of the thickness Z14 of the optical lens 2. The thickness Z14 is smaller than the radius D11, and may be formed in the range of 40% to 55% of the radius D11. The thickness (Z14-Z13) at the central portion of the optical lens 3 is an interval between points P1 and P0, and may be formed in the range of 26% to 36% of the thickness Z14.

In addition, inflection points may be formed at the recess portion 34 and the exit surfaces 32 and 33 of the optical lens 3. An inflection point is formed at the low point P1 of the first total-reflection surface 34A, and the inflection point P11 may be formed at the change point to the second total-reflection surface 34B from the first total-reflection surface 34A. A curvature R11 of the first total-reflection surface 34A may be equal to or greater than the curvature R12 of the second total-reflection surface 34B, and greater than the curvature R13 of the third total-reflection surface 34C. For example, the curvature R11 may be formed in the range of 0.5 mm to 1 mm.

The curvature R12 of the second total-reflection surface 34B is a curvature of a curved surface connecting adjacent inflection points P11 and P12 with each other. The curvature R12 may be greater than the curvature R13 of the third total-reflection surface 34C. For example, the curvature R12 may be formed in the range of 0.5 mm to 1 mm.

The curvature R13 of the third total-reflection surface 34C is a curvature of a segment connecting adjacent inflection points P12 and P13 with each other. The curvature R13 may be at least three times smaller than the curvatures R11 and R12 of the first and second total-reflection surfaces 34A and 34B, and may be at least twice greater than the curvature R14 of the convex portion 35. The curvatures R11 and R13 of the first total-reflection surface 34A and the third total-reflection surface 34C are curvatures of curved surfaces that are concave in the direction of the optical axis Z. The curvatures R12 and R14 of the second total-reflection surface 34B and the convex portion 35 are curvatures of curved surfaces that are convex in the direction of the optical axis Z. The curvature R14 of the convex portion 35 may be formed in the range of 0.5 mm to 0.1 mm.

The curvature R13 of the third total-reflection surface 34C makes a difference from the curvature R12 of the second total-reflection surface 34B and the curvature R14 of the convex portion 35 by at least two times. The third total-reflection surface 34C and the convex portion 35 have surfaces curved in directions opposite to each other and are formed with curvatures different from each other. Accordingly, the convex portion 35 may have a surface more rapidly curved than the third total-reflection surface 34C. The curvature R14 of the convex portion 35 is smaller than the curvatures R11, R12, and R13 of the first to third total-reflection surfaces 34A, 34B, and 34C.

The exit surface 32 is connected with the outer surface 33 while representing the convex curvature R14 outward of the optical axis Z from the inflection point P14 connected with the convex portion 35 to the last inflection point P15. The inflection point P14 may serve as the apex 32A of the optical lens 2 as shown in FIG. 4, but the embodiment is not limited thereto.

The outer surface 33 is connected between the inflection point P15 of the exit surface 32 and the low point P16, and may have a linear contour. The position of the inflection point P15 between the exit surface 32 and the outer surface 33 may be provided on a line lower than the position of the low point P1 of the recess portion 34 based on a horizontal segment, but the embodiment is not limited thereto.

Since the convex portion 35 protrudes from the top surface of the reflective member 11 while being positioned between the recess portion 34 and the exit surface 32, the width of the top surface of the reflective member 11 may be narrower than the width (or diameter) between the apexes P14 of the optical lens 3, and may be wider than the width (or diameter) between the first inflection points P13. In addition, the peripheral portion of the top surface of the reflective member 11, which serves as a contact point with the optical lens 3, may be lower than the apex P14 of the optical lens 3, and may be higher than the first inflection point P13.

According to the embodiment, the convex portion 35 is formed in the direction of the optical axis Z between the recess portion 34 having a plurality of total-reflection surfaces 34A to 34C and the exit surface 32. The convex portion 35 can prevent the reflective member 11, which is filled in the recess portion 34, from being provided beyond the recess portion 34. Therefore, the boundary of the reflective member 11 can be defined, and the reflective member 11 can be prevented from exerting an influence on the surface of the exit surface 32. Accordingly, the reliability for the distribution of the light orientation angles can be improved.

Figure 6:
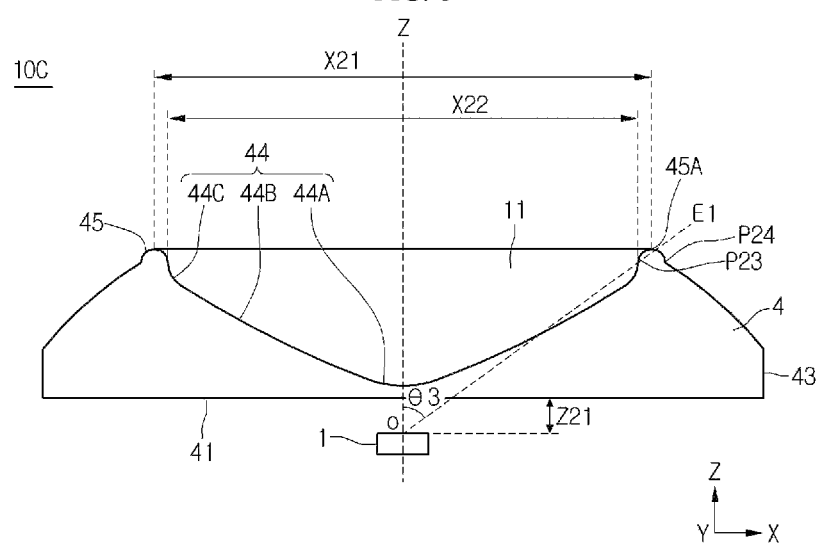
FIG. 6 is a side sectional view showing a light emitting device according to the fourth embodiment.
Figure 7:
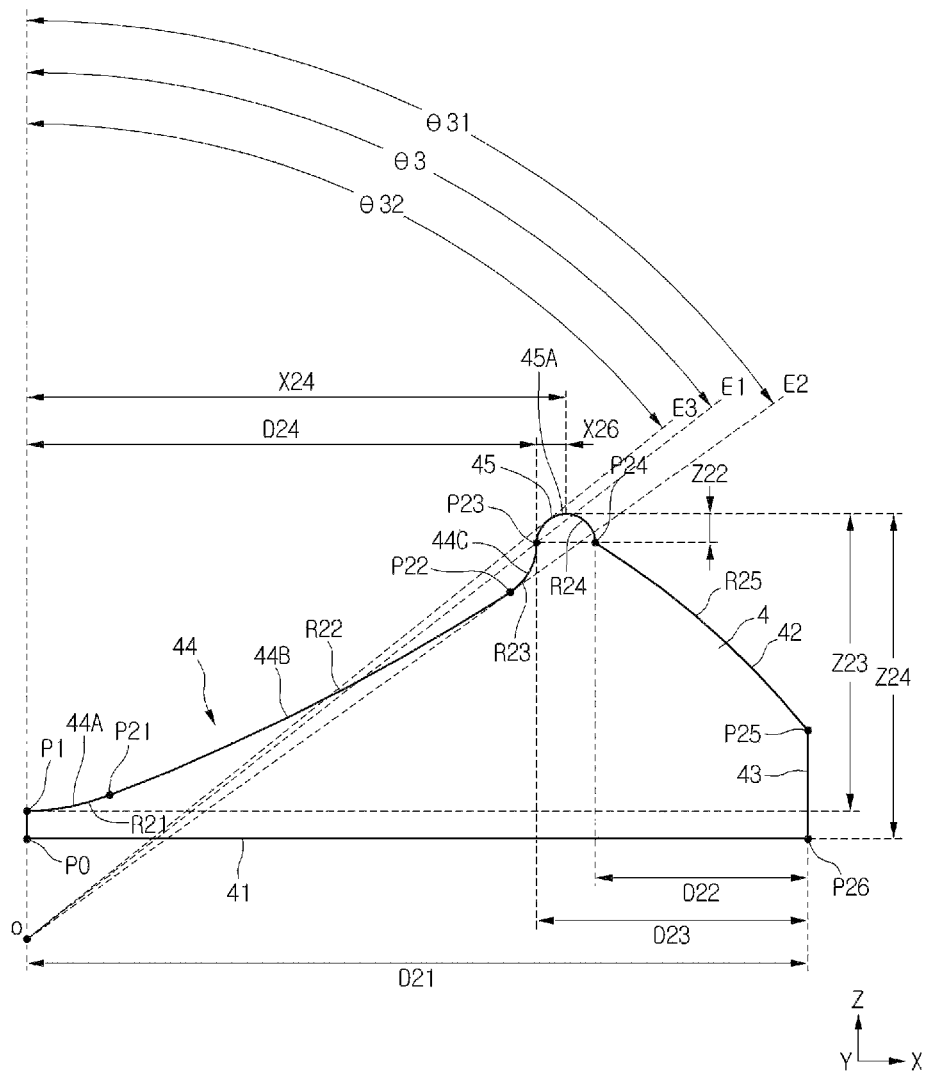
FIG. 7 is a partial enlarged view showing an optical lens of FIG. 6.

FIG. 6 is a side sectional view showing a light emitting device according to the fourth embodiment, and FIG. 7 is a partial enlarged view showing the light emitting device of FIG. 6.

Referring to FIGS. 6 and 7, a light emitting device 10C includes a light emitting chip 1, an optical lens 4 on the light emitting chip 1, and a reflective member 11 on the optical lens 4.

The light emitting chip 1 may be spaced apart from a light incident surface 41 of the optical lens 4 by a predetermined distance Z21. The distance Z21 may be 0.01 mm or more, but the embodiment is not limited thereto. In this case, the central portion of the light emitting chip 1 may be provided concentrically with respect to the center of the optical lens 4.

The optical lens 4 includes the incident surface 41, an exit surface 42, an outer surface 43, a recess portion 44, and a convex portion 45. The incident surface 41 may include a flat surface or a flat surface, which is partially grooved, but the embodiment is not limited thereto.

The light exit region of the optical lens 4 includes the exit surface 42 and the outer surface 43. The exit surface 42 may be convex outward of the optical axis Z, and the outer surface 43 may have a curved surface or a flat surface having the contour of a vertical line.

The recess portion 44 includes a first total-reflection surface 44A, a second total-reflection surface 44B, and a third total-reflection surface 44C. The first total-reflection surface 44A has the same center as that of the optical axis Z, and has the concave shape toward the light emitting chip 1. The recess portion 44 is recessed toward the light emitting chip 1 from an apex. The recess portion 44 may have a rotational symmetry shape about the optical axis Z. The first total-reflection surface 44A may have a hemispherical shape. The second total-reflection surface 44B is provided in the direction opposite to those of the first and third total-reflection surfaces 44A and 44C, and has a curved surface that is convex with respect to the optical axis Z. The third total-reflection surface 44C has a curved surface that is concave.

The convex portion 45 is formed with a surface convex in the direction corresponding to the optical axis Z between first and second inflection points P23 and P24.

The convex portion 45 is connected between the third reflective surface 44C and the exit surface 42. The convex portion 45 is provided more inward of an apex P23 of the exit surface 42, that is, provided closer to the optical axis Z than the first exit surface 42. The section of the convex portion 45 has a curved surface convex in the direction of the optical axis Z.

In this case, when the light emitting chip 1 is employed as a reference point O, an angle θ3 formed between a first virtual segment E1, which passes through both of the reference point O and the first inflection point P23, and the optical axis Z may be in the range of 40° to 60°.

An angle θ31 formed between a second virtual segment E2, which serves as a tangential line making contact with the outer curved surface of the recess portion 24 while starting from the reference point O, and the optical axis Z is greater than the angle v3. For example, the angle 11a may be in the range of 41° to 75°.

An angle 132a formed between a third vertical segment O3, which serves as a tangential line making contact with the innermost curved surface of the convex portion 45 while starting from the reference point O, and the optical axis Z may at an angle equal to or smaller than the angle v3. The optical axis Z may be formed in the range of 35° to 65°.

Since the convex portion 45 is connected between the first and second inflection points P23 and P24, the inner region of the convex portion 45 is provided inward of a diameter X21 between apexes 45A of the optical lens 4, and provided outward of a diameter X22 between the first inflection points P23.

Since the convex portion 45 is provided inward of the second virtual segment E2 passing the outermost portion of the recess portion 44 from the reference point O, the convex portion 45 hardly exerts an influence on the light emitted from the light emitting chip 1. In other words, since the convex portion 45 is actually provided at a region to which the light emitted from the light emitting chip 1 is not directly incident, the convex portion 45 may not exert an influence on the distribution of the light orientation angle. Accordingly, the convex portion 45 may improve the product yield of the optical lens 4.

When viewed from the top, the optical lens 4 has a circular shape, and a radius D21 of the optical lens 4 is in the range of 2.50±0.5 mm, but the embodiment is not limited thereto. The convex portion 45 may have a ring shape, and the ring shape may have a continuous dam structure along the peripheral portion of the recess portion 44.

A distance D24 between the optical axis Z and a first inflection point P23 may be formed in the range of 60% to 70% of the radius D21. For example, the distance D24 may be in the range of 1.6±0.5 mm.

A distance X24 between the optical axis Z and the apex 45A is longer than the distance D24, and may be formed in the range of 65% to 75% of the radius D21. For example, the distance X24 may be formed in the range of 1.7±0.5 mm. The segment perpendicular to the first inflection point P23 is spaced apart from the outermost part of the optical lens 4 by a predetermined distance D23. The distance D23 may be formed in the range of 30% to 40% of the radius D21. The segment perpendicular to a second inflection point P24 of the first exit surface 42 is spaced apart from the outermost portion of the optical lens 4 by a predetermined distance D22. The distance D22 may be shorter than the distance D23, and may be formed in the range of 25% to 35% of the radius D21.

The inner region of the convex portion 45 is provided inward of a tangential line E2, which passes a third total-reflection surface 44C of the recess portion 44 while making contact with the third total-reflection surface 44C of the recess portion 44, at the region between the first inflection point P24 and the apex 45A.

A distance X26 between the apex 45A of the optical lens 4 and a segment perpendicular to a first inflection point P23 is ½ of the width of the convex portion 45. The distance X26 may be formed in the range of 0.05 mm to 0.11 mm. A distance Z12 between the apex 45A and a segment horizontal to the first inflection point P23 is the height of the convex portion 45. The distance Z12 may be formed in the range of 0.07 mm to 0.11 mm. The convex portion 45 is provided inward of the apex 45A of the optical lens 4 to form an outer dam of the reflective member 11, thereby effectively preventing the reflective member 11 from being provided beyond the convex portion 45. The inner region of the convex portion 45 makes contact with the reflective member 11, and the outer region of the convex portion 45 does not make contact with the reflective member 11. The outer region of the convex portion 45 is provided in opposition to the inner region of the convex portion 45 about the apex 45A.

Referring to FIG. 7, a thickness Z24 of the optical lens 2 may be formed in the range of 1 mm±0.5 mm, and a depth Z23 of the recess portion 44 may be formed in the range of 87% to 93% of the thickness Z24 of the optical lens 4. The thickness Z24 is smaller than the radius D21, and may be formed in the range of 40% to 55% of the radius D21. The thickness (Z24-Z23) at the central portion of the optical lens 4 is the distance between the points P1 and P0, and may be in the range of 7% to 13% of the thickness Z24.

In addition, an inflection point may be formed at a change point from the recess portion 44 of the optical lens 4 to the exit surface 42 of the optical lens 4. An inflection point is formed at the low point P1 of the first total-reflection surface 44A, and the inflection point P21 may be formed at the change point to the second total-reflection surface 44B from the first total-reflection surface 44A. A curvature R21 of the first total-reflection surface 44A may be smaller than a curvature R22 of the second total-reflection surface 44B, and greater than a curvature R23 of a third total-reflection surface 44C. For example, the curvature R21 may be formed in the range of 0.4 mm to 0.9 mm.

The curvature R22 of the second total-reflection surface 44B is formed between the adjacent inflection points P21 and P22, and may be greater than the curvature R23 of the third total-reflection surface 44C. For example, the curvature R22 may be formed in the range of 6.5 mm to 7.5 mm.

The curvature R23 of the third total-reflection surface 44C is a curvature of a curved surface connecting the adjacent inflection points P22 and P23. The curvature R23 may be smaller than the curvature R21 of the first total-reflection surface 44A by at least three times, and may be greater than the curvature R24 of the convex portion 45 by at least twice. The curvatures R21 and R23 of the first and third total-reflection surfaces 44A and 44C are curvatures of curved surfaces that are concave in the direction of the optical axis Z. The curvature R24 of the convex portion 45 is a curvature of a curved surface that is convex in the direction of the optical axis Z. The curvature R24 of the convex portion 45 may be formed in the range of 0.7 mm to 0.12 mm.

Since the curvature R23 of the third total-reflection surface 44C is greater than the curvature R24 of the convex portion 45 by at least twice, the contour connected with the convex portion 45 may have a rapidly curved surface. The curvature R24 of the convex portion 45 is smaller than the curvatures R21, R22, and R23 of the first to third total-reflection surfaces 44A, 44B, and 44C.

The exit surface 42 is connected with the outer surface 43 while representing a convex curvature R24 outward of the optical axis Z from a second inflection point P24 connected with the convex portion 45 to the inflection point P25. The inflection point P24 is provided outward of the apex 45A of the optical lens 4.

The outer surface 43 is connected between an inflection point P25 and a low point P26 of the exit surface 42, and may be formed in the shape of a linear contour. The position of the inflection point P25 between the exit surface 42 and the outer surface 43 may be higher than the position of the low point P1 of the recess portion 44 based on a horizontal segment, but the embodiment is not limited thereto.

Since a boundary is set at the top surface of the reflective member 11 by the convex portion 45, the width of the top surface of the reflective member 11 may be narrower than the width (or diameter) between apexes 45A of the optical lens 4, and may be wider than the width (or diameter)

between the first inflection points P23. In addition, the peripheral portion of the top surface of the reflective member 11, which serves as a contact point with the optical lens 4, may be lower than the apex P45A of the optical lens 4, and may be higher than the first inflection point P23.

According to the embodiment, the convex portion 45 is formed in the direction of the optical axis Z between the recess portion 44 having a plurality of total-reflection surfaces 44A to 44C and the exit surface 42. The convex portion 45 can prevent the reflective member 11, which is filled in the recess portion 44, from being provided beyond the recess portion 44. Therefore, the boundary of the reflective member 11 can be defined, and the reflective member 11 can be prevented from exerting an influence on the surfaces of the exit surfaces 42 and 43. Accordingly, the reliability for the distribution of the light orientation angles can be improved.

Figure 8:
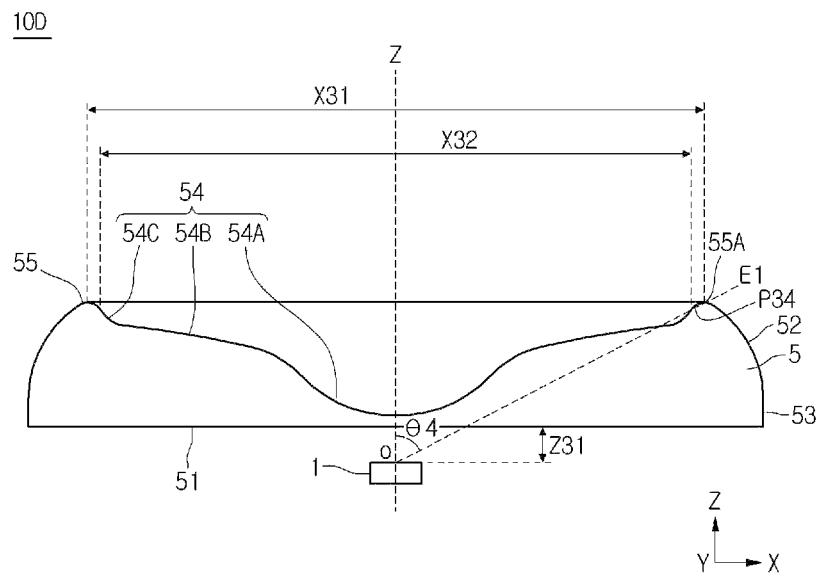
FIG. 8 is a side sectional view showing a light emitting device according to the fifth embodiment.
Figure 9:
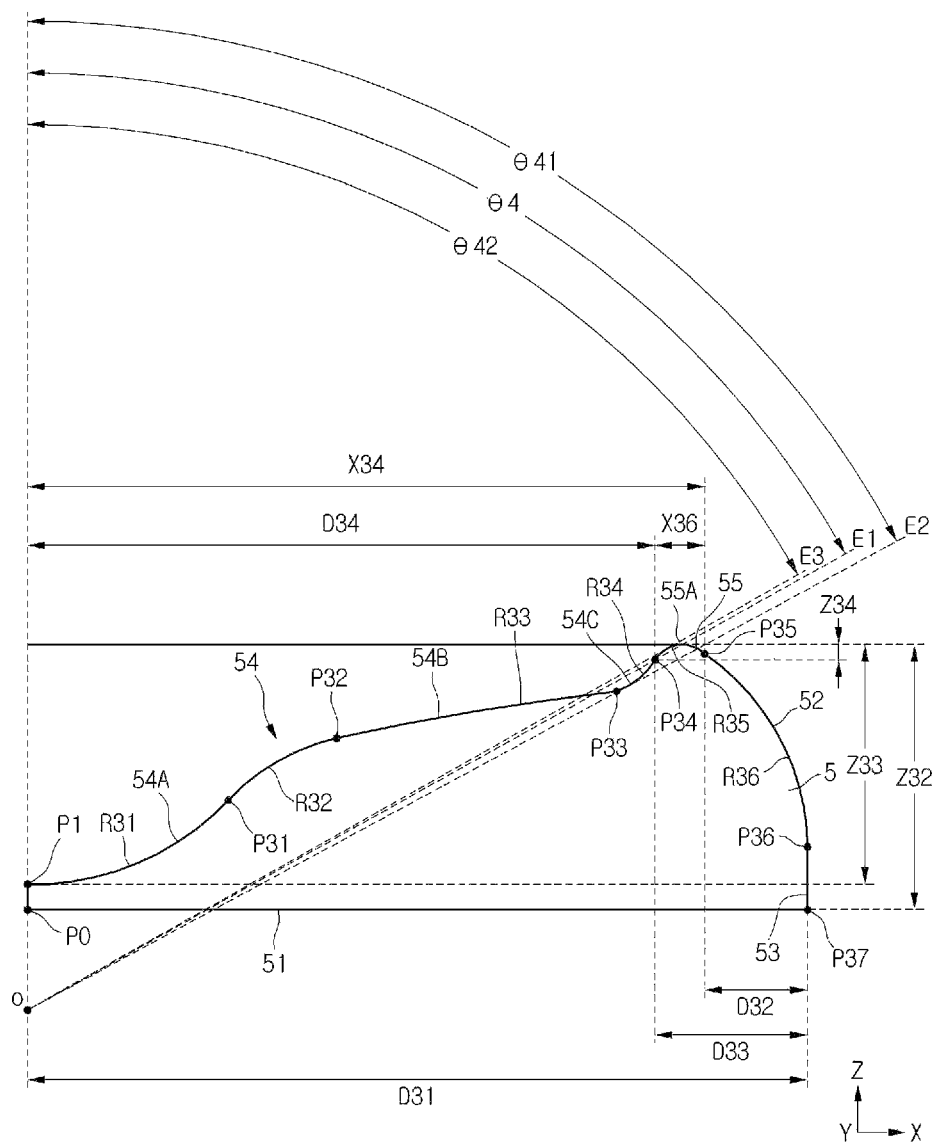
FIG. 9 is a partial enlarged view showing an optical lens of FIG. 8.

FIG. 8 is a side sectional view showing a light emitting device according to the fifth embodiment. FIG. 9 is a partial enlarged view of FIG. 8.

Referring to FIG. 8, a light emitting device 10D includes a light emitting chip 1, an optical lens 5 on the light emitting chip 1, and a reflective member 11 on the optical lens 5.

The light emitting chip 1 may be spaced apart from a light incident surface 51 of the optical lens 5 by a predetermined distance Z31. The distance Z31 may be 0.01 mm or more, but the embodiment is not limited thereto. In this case, the central portion of the light emitting chip 1 may be provided concentrically with respect to the center of the optical lens 5

The optical lens 5 includes an incident surface 41, an exit surface 42, an outer surface 53, a recess portion 44, and a convex portion 45. The incident surface 51 may include a flat surface or a flat surface, which is partially grooved, but the embodiment is not limited thereto.

The light exit region of the optical lens 5 includes the exit surface 52 and the outer surface 53. The exit surface 52 may be convex outward of the optical axis Z, and the outer surface 53 may have a curved surface or a flat surface having the contour of a vertical line.

The recess portion 54 includes a first total-reflection surface 54A, a second total-reflection surface 54B, and a third total-reflection surface 54C. The first total-reflection surface 54A has the same center as that of the optical axis Z, and has the concave shape in the direction of the light emitting chip 1. The recess portion 54 may be recessed in the direction of the light emitting chip 1, and may have a rotational symmetry shape about the optical axis Z. The first total-reflection surface 54A may have a hemispherical shape. The second total-reflection surface 54B is provided in the direction opposite to those of the first and third total-reflection surfaces 54A and 54C, and has a curved surface that is convex with respect to the optical axis Z. The third total-reflection surface 54C has a curved surface that is concave.

The convex portion 55 has a curved surface that is convex in the direction of the optical axis Z between a first inflection point P34 and an apex 55A.

The convex portion 55 is connected between the third total-reflection surface 54C and the exit surfaces 52 and 53. The convex portion 55 has the apex 55A of the optical lens 5. In other words, the convex portion 55 is provided closer to the optical axis Z than the first exit surface 52. The section of the convex portion 55 has a curved surface that is convex in the direction of the optical axis Z.

In this case, when the light emitting chip 1 is employed as a reference point O, an angle θ4 formed between a first virtual segment E1, which passes through both of the reference point O and the first inflection point P34, and the optical axis Z may be in the range of 40° to 60°.

An angle θ41 formed between a second virtual segment E2, which serves as a tangential line making contact with the outer curved surface of the recess portion 54 while starting from the reference point O, and the optical axis Z is greater than the angle θ5. For example, the angle θ41 may be in the range of 41° to 75°.

An angle θ42 formed between a third vertical segment E3, which serves as a tangential line making contact with the innermost curved surface of the convex portion 55 while starting from the reference point O, and the optical axis Z may at an angle equal to or smaller than the angle θ4. The optical axis Z may be formed in the range of 35° to 65°.

The convex portion 55 is formed in a ring shape between the first inflection point P34 and the apex 55A. The ring shape protrudes around the recess portion 54 while representing a dam shape. The diameter of the convex portion 55 is shorter than a diameter X31 between apexes 55A of the optical lens 5, and wider than a diameter X32 between the first inflection points P34.

Since the convex portion 55 is provided inward of the second virtual segment E2 passing the outermost portion of the recess portion 24 from the reference point O, the convex portion 55 hardly exerts an influence on the light emitted from the light emitting chip 1. In other words, since the convex portion 55 is actually provided at a region to which the light emitted from the light emitting chip 1 is not directly incident, the convex portion 55 may not exert an influence on the distribution of the light orientation angle. Accordingly, the convex portion 55 may improve the product yield of the optical lens 2.

When viewed from the top, the optical lens 5 has a circular shape, and a diameter of the optical lens 5 is in the range of 2.50±0.5 mm, but the embodiment is not limited thereto.

A distance D34 between the optical axis Z and the first inflection point P34 may be formed in the range of 75% to 85% of the distance D31. For example, the distance D34 may be formed in the range of 2.0±0.5 mm.

A distance X34 between the optical axis Z and a second inflection point P35 of the exit surface 52 is longer than the distance D34, and may be formed in the range of 82% to 86% of the radius D31. For example, the distance D34 may be formed in the range of 2.1±0.2 mm. The segment perpendicular to the first inflection point P34 is spaced from the outermost portion of the optical lens 5 by a predetermined distance D32, and the distance D32 may be formed in the range of 15% to 25% of the radius D31. The segment perpendicular to the apex 55A is spaced apart from the outermost portion of the optical lens 5 by the distance D32, and the distance D32 may be shorter than the radius D31.

The apex 55A of the convex portion 55 is provided inward of the tangential line making contact with the third total-reflection surface 54C of the convex portion 55 at the region between the first inflection point P34 and the apex P35 (e.g, second inflection point) of the exit surface 52.

A distance X36 between the apex 55A and a segment perpendicular to the first inflection point P34 is in the range of ½ to ⅓ of the width of the convex portion 55. The distance X36 may be formed in the range of 0.06 mm to 0.12 mm. A distance Z34 between the apex 55A and a segment horizontal to the first inflection point P34 is a height of the convex portion 55. The distance Z34 may be in the range of 0.03 mm to 0.07 mm. The inner region of the convex portion 55 is provided inward of the apex 55A of the optical lens 5, to serve as an outer boundary of the reflective member 11, thereby effectively preventing the reflective member 11 from being positioned beyond the convex portion 55.

Referring to FIG. 9, a thickness Z34 of the optical lens 5 may be formed in the range of 0.8 mm±0.2 mm, and a depth Z33 of the recess portion 54 may be formed in the range of 87% to 92% of the thickness Z34 of the optical lens 5. The thickness Z54 is smaller than the radius D11, and may be formed in the range of 30% to 55% of the radius D11. The thickness (Z34-Z33) at the central portion of the optical lens 3 is an interval between points P1 and P0, and may be formed in the range of 8% to 13% of the thickness Z34.

In addition, inflection points may be formed at the recess portion 54 and the exit surfaces 52 and 53 of the optical lens 5. An inflection point is formed at the low point P1 of the first total-reflection surface 54A, and the inflection point P31 may be formed at the change point to the second total-reflection surface 54B from the first total-reflection surface 54A. A curvature R31 of the first total-reflection surface 54A is a curvature of a curved surface that is concave in the direction of the optical axis Z. The curvature R31 may be greater than a curvature R33 of the third total-reflection surface 54C. The curvature R31 may be formed in the range of 0.7 mm to 1 mm.

The second total-reflection surface 54B includes a plurality of inflection points P31, P32, and P33 between the first and third total-reflection surfaces 54A and 54C, and is connected therebetween through convex curved surfaces. A curvature R32 of a contour between the inflection points P31 and P32 at the second total-reflection surface 54B may be smaller than the curvature R33 of the contour between the inflection points P32 and P33. The curvature R32 may be 1 mm or less, and the curvature R33 may be 6 mm or more.

The curvature R34 of the third total-reflection surface 54C is the curvature of a curved surface connecting the inflection points P53 and P54 adjacent to each other. The curvature R34 may be smaller than the curvature R31 of the first total-reflection surface 54A by at least three times, and may be greater than the curvature R35 of the convex portion 55 by at least two times. The curvatures R31 and R33 of the first and third total-reflection surfaces 54A and 54C are curvatures of curves surfaces that are concave in the direction of the optical axis Z. The curvature R35 of the convex portion 55 may be formed in the range of 0.8 mm to 0.12 mm.

The curvature R34 of the third total-reflection surface 54C makes a difference from the curvature R35 of the convex portion 55 by at least two times. Since the direction of the curved surface of the convex portion 55 is opposite to the direction of the curved surface of the third total-reflection surface 54C, the convex portion 55 may have a rapidly-curved surface. The curvature R35 of the convex portion 55 is smaller than the curvatures R31 and R32 of the first and second total-reflection surfaces 54A and 54B.

The exit surface 52 is connected with the outer surface 33 while representing the convex curvature R36 outward of the optical axis Z from the inflection point P35 connected with the convex portion 55 to the last inflection point P36. The inflection point P35 is provided outward of the apex 55A of the optical lens 5.

The outer surface 53 may be connected between the inflection point P36 of the exit surface 52 and a low point P37, and may be formed in the shape of a linear contour. The position of the inflection point P36 between the exit surface 52 and the outer surface 53 may be higher than the position of the low point P1 of the recess portion 54 based on a horizontal segment, but the embodiment is not limited thereto.

Since a boundary is set at the top surface of the reflective member 11 by the convex portion 55, the width of the top surface of the reflective member 11 may be narrower than the width (or diameter) between apexes 55A of the optical lens 5, and may be wider than the width (or diameter) between the first inflection points P34. In addition, the peripheral portion of the top surface of the reflective member 11, which serves as a contact point with the optical lens 5, may be lower than the apex P55A of the optical lens 5, and may be higher than the first inflection point P34.

According to the embodiment, the convex portion 55 is formed in the direction of the optical axis Z between the recess portion 54 having a plurality of total-reflection surfaces 54A to 54C and the exit surface 52. The convex portion 55 can prevent the reflective member 11, which is filled in the recess portion 54, from being provided beyond the recess portion 54. Therefore, the boundary of the reflective member 11 can be defined, and the reflective member 11 can be prevented from exerting an influence on the surface of the exit surfaces 52 and 53. Accordingly, the reliability for the distribution of the light orientation angles can be improved.

The reflective member provided on the recess portion of the optical lens disclosed according to the first to fourth embodiments may be omitted, but the embodiment is not limited thereto.

FIGS. 10 to 14 are views showing the distribution of light orientation angels through the optical lenses according to the first and second embodiments.

Figure 10:
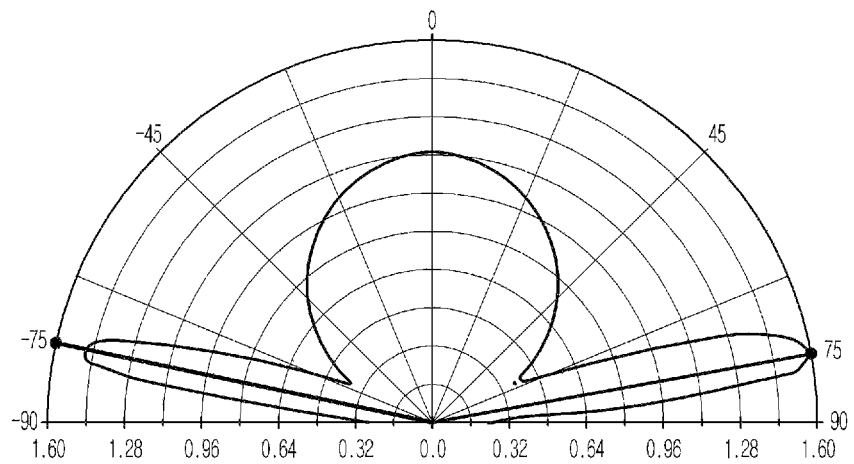
FIGS. 10 to 14 are views showing the distribution of orientation angles of the light emitting devices of FIGS. 1 and 2.
Figure 11:
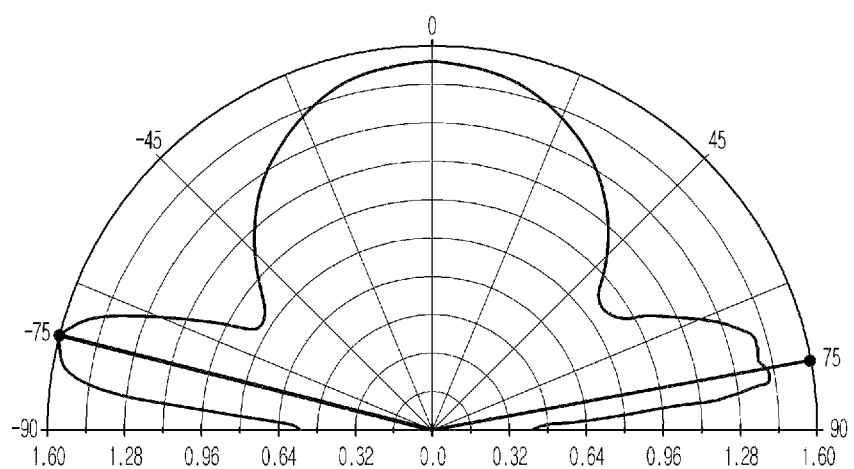

FIGS. 10 and 11 show cases that the reflective member is not applied to the optical lens according to the embodiment, and show the distribution of the light orientation angles in first and second directions perpendicular to each other. The distribution characteristic of light shown in FIG. 10 represents the distribution of the orientation angles in the first direction (longitudinal direction or lengthwise direction) of the optical lens. The distribution characteristic of light shown in FIG. 11 represents the distribution of the orientation angles in the second direction (transverse direction or widthwise direction) of the optical lens. In this case, the widthwise direction of the optical lens is a longitudinal direction, and a direction perpendicular to a transverse direction (or widthwise direction) of the optical lens. The length of the optical lens in the longitudinal direction may be equal to or different from the length of the optical lens in the transverse direction.

Figure 12:
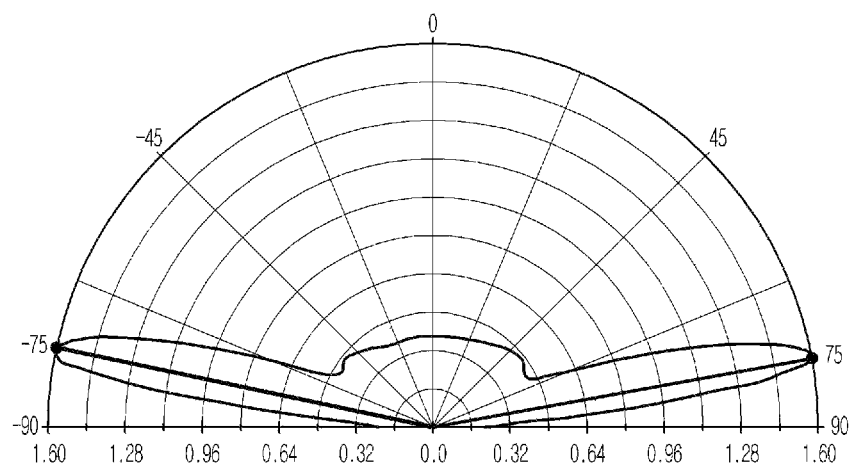
Figure 13:
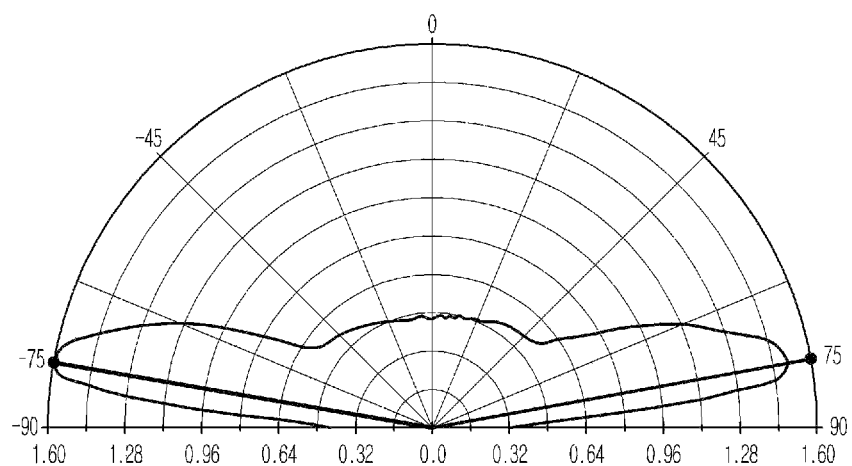

FIGS. 12 and 13 show cases that a reflective member is applied to the optical lens according to the embodiment. FIGS. 12 and 13 show the distribution of the wide light orientation angles in the first and second directions, for example, shows the distribution of the orientation angles more than 155°. In addition, when the reflective member is applied, the intensity of a center beam is represented with 30% or less in FIG. 12, and represented with 35% or less in FIG. 13.

Figure 14:
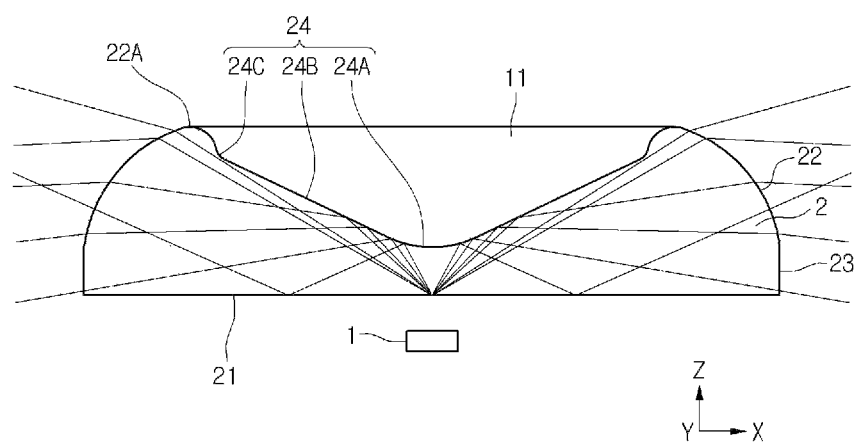

FIG. 14 is a view showing a ray tracing result in the light emitting device of FIG. 2, in which light is not incident into the convex portion 25 of the optical lens 2. The convex portion 25 defines the boundary of the reflective member 11 to prevent the exit surface 22 of the optical lens 2 from being affected by the reflective member 11. The assembling structure of the disclosed light emitting device having the optical lens 2 with the light emitting chip 1 may be modified, and the details thereof will be described in the following embodiments.

Figure 15:
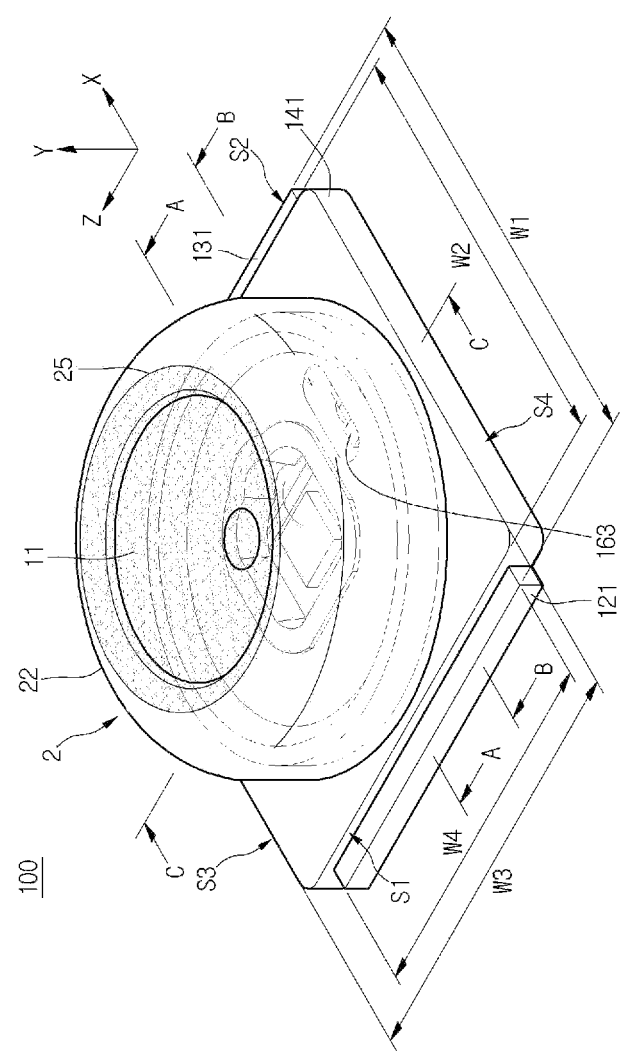
FIG. 15 is a perspective view showing a light emitting device having the optical lens of FIG. 2 according to the sixth embodiment.
Figure 16:
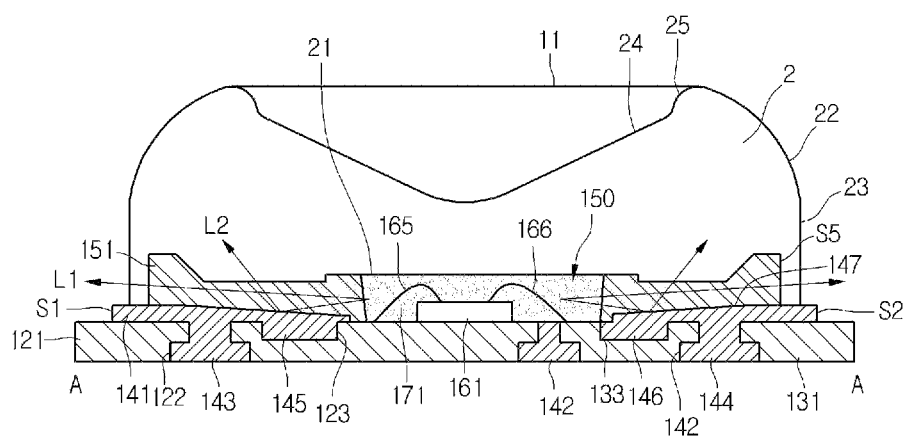
FIG. 16 is a sectional view taken along line A-A of the light emitting device of FIG. 15.
Figure 17:
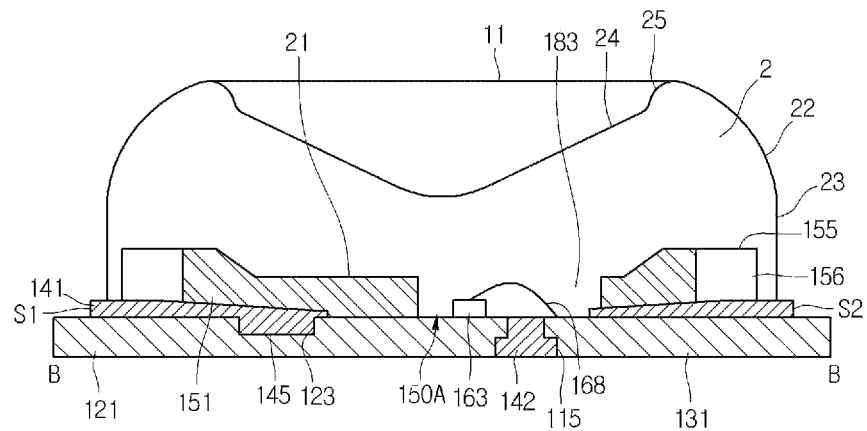
FIG. 17 is a sectional view taken along line B-B of the light emitting device of FIG. 15.
Figure 18:
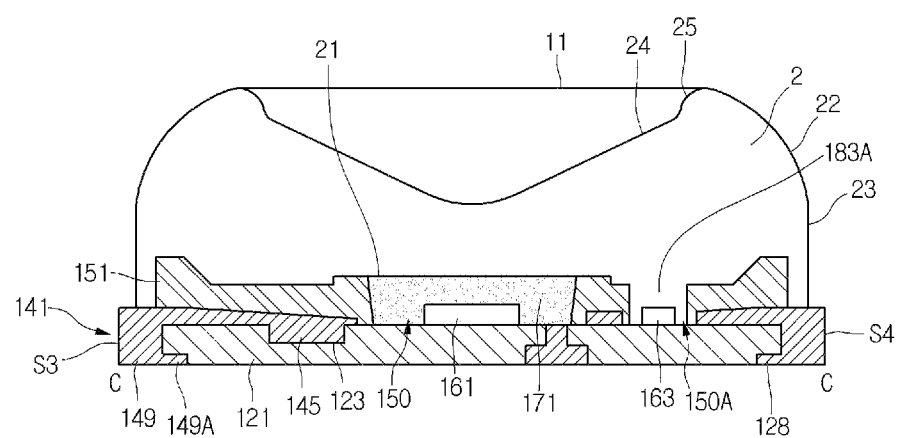
FIG. 18 is a sectional view taken along line C-C of the light emitting device of FIG. 15.
Figure 19:
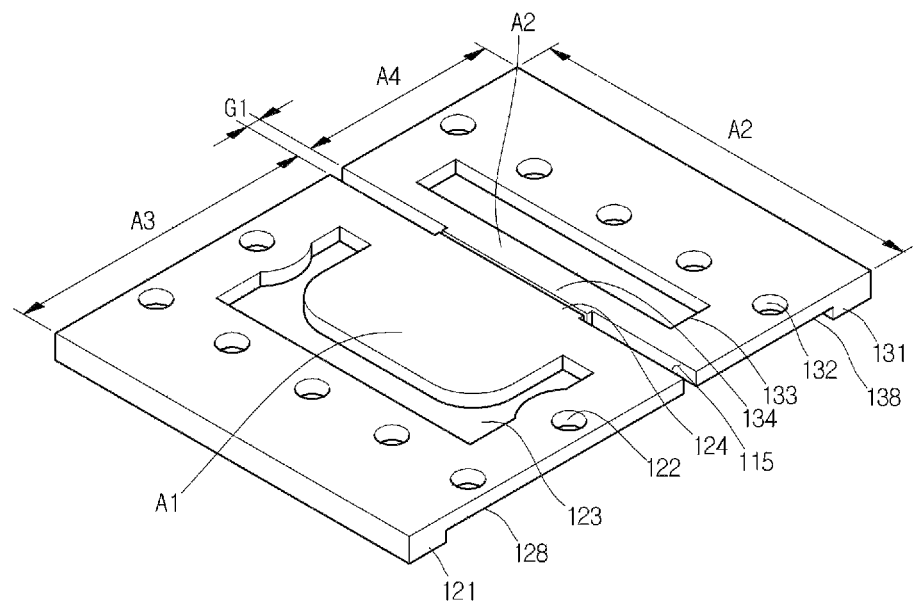
FIG. 19 is a perspective view showing a lead frame in a light emitting device of FIG. 15.

FIG. 15 is a perspective view showing a light emitting device according to the sixth embodiment, and FIG. 16 is a sectional view taken along line A-A of the light emitting device shown in FIG. 15. FIG. 17 is a sectional view taken along line B-B of the light emitting device shown in FIG. 15. FIG. 18 is a sectional view taken along line C-C of the light emitting device shown in FIG. 15. FIG. 19 is a perspective view showing a lead frame of the light emitting device of FIG. 15.

Referring to FIGS. 15 to 19, a light emitting device 100 includes a plurality of lead frames 121 and 131 spaced apart from each other, a first body 141 provided in the lead frames 121 and 131, a second body 151 having a first opening 150 and made of a material different from that of the first body 141 on the first body 141, a light emitting chip 161 provided on at least one of the lead frames 121 and 131, a transparent resin layer 171 formed in the first opening 150 while surrounding the light emitting chip 161, and an optical lens 181 on the transparent resin layer 171 and the second body 151.

According to the light emitting device 100, a first direction X may refer to the direction of a length W1, a second direction Z perpendicular to the first direction X may refer to a width W3, and a direction perpendicular to a top surface of the light emitting chip 161 may refer to the direction Y of a normal line to the light emitting chip 161.

The length W1 of the light emitting device 100 may be the distance between the lateral sides of the lead frames 121 and 131, and may be longer than a length W2 of the first body 141. End portions of the lead frames 121 and 131 may protrude out of an outer sidewall of the first body 141 to adhere to an adhesive member such as a solder paste. The width of the light emitting device 100 may be the width W3 of the first body 141. Since the width W3 of the first body 141 is wider than a width W4 of each of the lead frames 121 and 131, the light orientation angle can be provided with a wide distribution.

As shown in FIGS. 16 and 19, the lead frames 121 and 131 include the first lead frame 121 and the second lead frame 131. The first lead frame 121 includes a first groove 123 and a first hole 122. The first groove 123 may be formed at a depth lower than that of a top surface of the first lead frame 121, and provided at a peripheral portion of a chip region A1. In this case, the peripheral portion of the chip region A1 may be a region between the chip region A1 and one lateral side of the first lead frame 121, or at least two lateral sides of the first lead frame 121. The thickness of the first lead frame 121 in the first groove 123 may be equal to the thickness of a portion of the first lead frame 121 without the first groove 123, or may have a thickness as thin as that of the region of the first groove 123. Therefore, a portion of the first lead frame 121 opposite to the first groove 123 may protrude or may have a flat structure. A plurality of first holes 122 are spaced apart from each other, and provided between the first groove 123 and the lateral sides of the first lead frame 121.

The second lead frame 131 includes a second groove 133 and a second hole 132. The second groove 133 has a depth lower than that of a top surface of the second lead frame 131, and is lengthwise formed along the direction of a width W4 of the second lead frame 131. The width of the second groove 133 may be longer than the length A4 of the second lead frame 131. The second groove 133 may be provided at the outside of a bonding region A2, that is, at an opposite region of the first lead frame 121. A plurality of holes 132 may be arranged with a predetermined interval therebetween at the outside of the second groove 133. The second lead frame 131 at the second groove 133 may have the thickness equal to that of a portion of the lead frame 131 without the second groove 133, or may have the thickness as thin as the depth of the second groove 133. Therefore, a portion of the second lead frame 131 opposite to the second groove 133 may protrude or may have a flat structure.

The width A3 of the first lead frame 121 may be longer than the width A4 of the second lead frame 131. In addition, the first lead frame 121 having the light emitting chip may be formed with a wider area.

The first and second lead frames 121 and 131 includes at least one of metallic materials such as titanium (Ti), copper (Cu), nickel (Ni), gold (Au), chrome (Cr), tantalum (Ta), platinum (Pt), tin (Sn), silver (Ag), phosphorous (P). The first and second lead frames 121 and 131 may include a single metallic layer or metallic layers different from each other, but the embodiment is not limited thereto.

One or at least two of the first holes 122 and the second holes 132 may have a wider lower portion and a narrower upper portion. At least of the first and second holes 122 and 132, and the first and second grooves 123 and 133 may not be formed.

A first end portion 124 of the first lead frame 121 corresponds to a second end portion 134 of the second lead frame 131. A gap 115 between the first end portion 124 of the first lead frame 121 and the second end portion 134 of the second lead frame may have an interval G1 at the outer portion thereof greater than an interval at the center thereof, or may have the same interval at the outer portion and the center thereof. The first end portion 124 of the first lead frame 121 is closer to the second end portion 134 of the second lead frame 131 are provided with a narrower interval therebetween, so that the bonding space among the light emitting chip 161, a first wire 166, and a second wire 167 can be ensured.

The first lead frame 121 includes the first end portion 124 and a first step structure 128 formed along both bent lateral sides of the first end portion 124. In the first step structure 128, an outer peripheral region of the bottom surface of the first lead frame 121 has a step structure. The first step structure 128 may be disposed in at least one lateral side of the first lead frame 121, but the embodiment is not limited thereto.

The second lead frame 131 includes the second end portion 134 and a second step structure 138 formed along both bent lateral sides of the second end portion 134. In the second step structure 138, an outer peripheral region of the bottom surface of the second lead frame 131 has a step structure. The second step structure 138 may be formed in at least one lateral side or at least two lateral sides of the second lead frame 131, but the embodiment is not limited thereto.

Although an example that two lead frames are formed in one group has been described, at least three lead frames may be formed. In addition, when viewed from the top, the first and second lead frames 121 and 131 may have a rectangular shape or another shape. In addition, at least a portion of the lead frames 121 and 131 may be bent, but the embodiment is not limited thereto.

As shown in FIGS. 16, 17, 19, and 20, the first body 141 is disposed on the first and second lead frames 121 and 131. The first body 141 spaces the first lead frame 121 from the second lead frame 131. The first body 141 supports and fixes the first and second lead frames 121 and 131.

The bottom surface of the first body 141 may be aligned in line with the bottom surfaces of the first and second lead frames 121 and 131. A top surface 147 may be spaced apart from the top surfaces of the first and second lead frames 121 and 131.

The first body 141 may include a material representing reflectance higher than transmittance with respect to the wavelength emitted from a light emitting chip 161. For example, the first body 141 may include a material representing reflectance of 70% or more. If the reflectance is 70% or more, the material of the first body 141 may be a non-transparent material. The first body 141 may include an insulating material based on resin. For example, the first body 141 may include a resin material such as polyphthalamide (PPA). The first body 141 may include silicon, epoxy resin, thermosetting resin including a plastic material, a high heat resistance material, and a high heat resistance material. The silicon includes white color resin. In addition, the first body 141 may selectively include acid anhydride, an antioxidant, a release agent, an optical reflector, an inorganic filling agent, a curing catalyst, a light stabilizer, a lubricant, or a titanium dioxide. The first body 141 may be molded by using at least one selected from the group consisting of epoxy resin, modified epoxy resin, silicon resin, modified silicon resin, acrylic resin, and urethane resin. For instance, the first body 141 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo (5,4,0) undecene-7) serving as a hardening accelerator and ethylene glycol, titanium oxide pigment or glass fiber serving as a promoter to the epoxy resin, but the embodiment is not limited thereto.

In addition, a light shielding material or a diffusing agent is contained in the first body 141, so that transmitted light can be reduced. Further, the first body 141 includes the mixture of the thermosetting resin and at least one selected from the group consisting of a diffusing agent, pigments, a phosphor material, a reflective material, a light-shielding material, a light stabilizer, and a lubricant, so that the first body 141 has a predetermined function.

The top surface 147 of the first body 141 is formed with an area larger than that of the bottom surface of the second body 151, thereby reflecting light traveling in the direction of the top surface 147 of the first body 141, so that light loss can be reduced.

Figure 20:
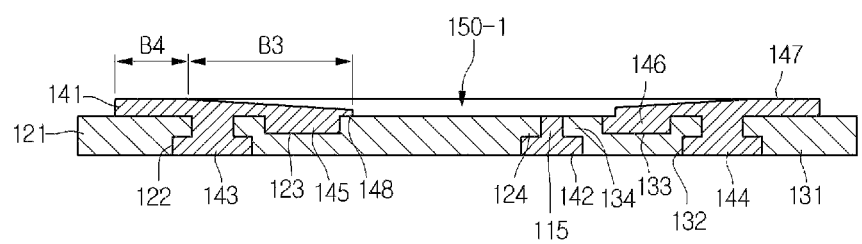
FIG. 20 is a sectional view showing an example in which a lead frame is assembled with the first body in the light emitting device of FIG. 15.
Figure 22:
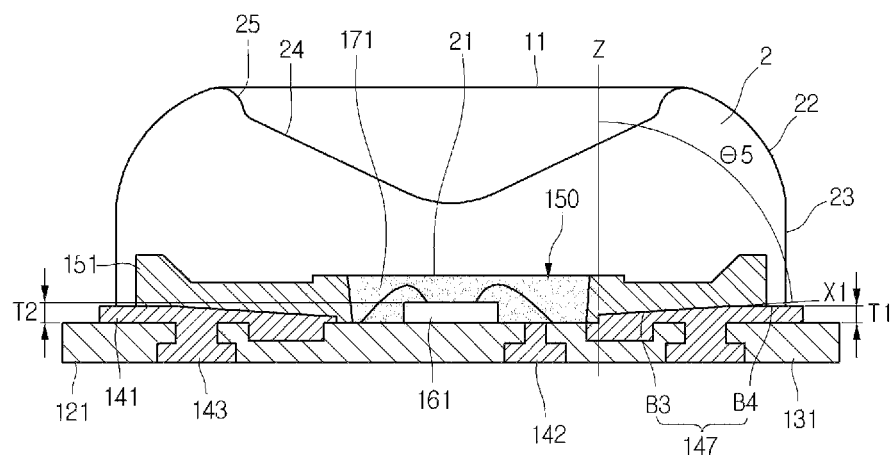
FIG. 22 is a view showing the height of the top surface and an inclination angle of the first body in the light emitting device of FIG. 15.

Referring to FIGS. 20 and 22, a portion of the first body 141 under the top surface of the lead frames 121 and 131 may be defined as a lower region of the first body 141, and a portion of the first body 141 on the top surface of the lead frames 121 and 131 may be defined as an upper region. In addition, the top surface 147 of the first body 141 may be classified into first and second top surface portions B3 and B4. The first top surface portion B3 may be closer to the light emitting chip 161 than the second top surface portion B4. The thickness of the first top surface portion B3 is gradually increased toward the outside thereof, so that an inclination surface may be formed. The second top surface portion B4 has a thickness greater than that of the first top surface portion B3, so that the second top surface portion B4 may have a flat surface or an inclined surface.

The maximum distance between the top surface 147 of the first body 141 and the top surface of the lead frames 121 and 131 is a thickness T1 of the second top surface portion B4 of the first body 141. The thickness T1 may be 50 μm or more. For example, the thickness T1 may be formed in the range of 50 μm to 300 μm. In this case, the thickness T1 of the second top surface portion B4 of the first body 141 may represent the thickest thickness in the upper region. In addition, the top surface 147 of the first body 141 may be provided on a line horizontally extending from the top surface of the light emitting chip 161, or the difference (T2-T1) between the line horizontally extending from the top surface 147 of the light emitting chip 161 and the top surface 147 of the first body 141 may be made to at least 1 μm, so that the light emitted from the light emitting chip 161 can be effectively incident and reflected. The first top surface portion B3 has a thickness thinner than that of the second top surface portion B4, so that a second light L2 travelling in a horizontal direction from the light emitting chip 161 can be effectively reflected as shown in FIG. 2.

A thickness T2 of the light emitting chip 161 may be formed in the range of 80 μm to 500 μm. For example, the thickness T2 may be formed in the range of 80 μm to 150 μm, but the embodiment is not limited thereto.

The first top surface portion B3 of the first body 141 may have an inclined surface which is not parallel to the top surfaces of the lead frames 121 and 131. For example, an angle between the first top surface portion B3 of the first body 141 and the top surfaces of the lead frames 121 and 131 may be formed in the range of 1° to 25°.

The second top surface portion B4 of the first body 141 may be parallel to the top surfaces of the lead frames 121 and 131. In this case, an angle θ5 between a line E4 extending from the first top surface portion B3 of the first body 141 and the normal line Z perpendicular to the top surface of the light emitting chip 161 may be 89° or less. For example, the angle θ5 may be formed in the range of 65° to 89°. An internal angle of the first top surface portion B3 of the first body 141 may be formed in the range of 135° to 180°. The light orientation angels of the light emitting device can be adjusted according to the angle θ5 between the line E4 extending from the first top surface portion B3 of the first body 141 and the normal line Z perpendicular to the top surface of the light emitting chip 161.

As shown in FIGS. 16 and 20, the first body 141 includes a separation part 142 and first to fourth coupling parts 143, 144, 145, and 146. The separation part 142 is provided in the gap 115 between the first and second lead frames 121 and 131. The width of a lower portion of the separation part 141 may be larger than the width of an upper portion of the separation part 141. The top surface of the separation part 141 may be formed horizontally to the top surfaces of the lead frames 121 and 131, or may be formed higher than the top surfaces of the lead frames 121 and 131. In this case, when the upper portion of the separation part 142 is higher than the top surfaces of the lead frames 121 and 131, the upper portion of the separation part 142 makes contact with the top surfaces of the first end portion 124 of the first lead frame 121 and the second end portion 134 of the second lead frame 131, thereby preventing moisture from being infiltrated.

The first coupling part 143 is formed in the first hole 122 of the first lead frame 121, and the second coupling part 144 is formed in the second hole 132 of the second lead frame 131. The third coupling part 145 is formed in the first groove 123 of the first lead frame 121, and the fourth coupling part 146 is formed in the second groove 133 of the second lead frame 131. The first body 141 may be tightly coupled with the first and second lead frames 121 and 131 through the separation part 142 and the first to fourth coupling parts 142, 144, 145, and 146.

Figure 21:
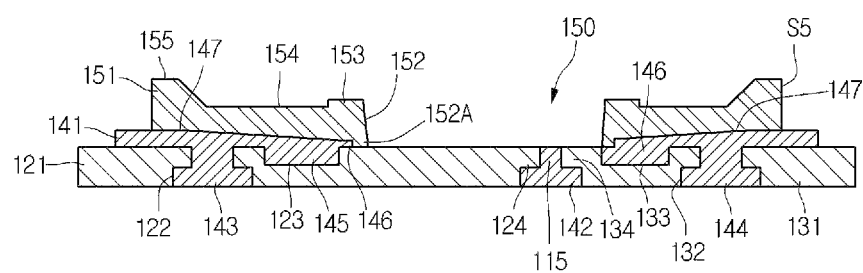
FIG. 21 is a sectional view showing an example in which a first body is assembled with the second body in the light emitting device of FIG. 15.

As shown in FIGS. 20 and 21, the inner portion 148 of the first body 141 further extends between the first groove 123 of the first lead frame 121 and an opening 150-1, so that the contact area between the first body 141 and the inner portion 152A of the second body 151 can be increased.

The first body 141 serves as a member to effectively reflect light of the light emitting chip 161, which may include a resin molded member. The first body 141 may be provided at the center thereof with the opening 150-1. The top surfaces of the first and second lead frames 121 and 131 may be exposed through the opening 150-1. The opening 150-1 may have a circular shape, a polygonal shape, or a shape having a curved surface. The first body 141 may have a substantially rectangular parallepiped shape. The outer peripheral portion of the first body 141 may have a polygonal shape when viewed from the top. Although the first body 141 has the rectangular parallelepiped shape, the first body 141 may have an oval shape, a circular shape, or another polygonal shape when viewed from the top.

As shown in FIGS. 15 and 16, an outer portion of the first lead frame 121 protrudes from the lower portion of a first outer surface 51 among four outer surface constituting the first body 141, and an outer portion of the second lead frame 131 protrudes from the lower portion of a second outer surface S2 opposite to the first outer surface 51. As shown in FIGS. 15 and 18, third and fourth outer surfaces S3 and S4 of the first body 141, which are opposite to each other, are formed outward of the outer surfaces of the first and second lead frames 121 and 131. An outer portion 149 of the first body 141 covers the outer surfaces of the first and second lead frames 121 and 131. A lower end portion 149A extends to the bottom surfaces of the first and second lead frames 121 and 131 from the outer portion 149 of the first body 141, so that the lower end portion 149A can be coupled with the step structures 128 and 138 as shown in FIG. 5.

As shown in FIG. 16, the second body 151 may be formed on the first body 141. The second body 151 may include a transparent material. For example, the second body 151 may include silicone resin or epoxy resin. The second body 151 may be formed through an injection molding scheme, and may include a transparent material. Accordingly, the second body 151 can effectively transmit first and second light L1 and L2 emitted from the light emitting chip 161.

An outer surface S5 of the second body 151 is provided inward of the outer sidewall 23 of the optical lens 2, and may make contact with a portion of the outer sidewall 23 of the optical lens 2. Accordingly, the coupling forth between the second body 151 and the optical lens 2 is increased. When viewed from the top, the second body 151 may have a circular shape. According to another embodiment, the second body 151 may have a polygonal shape or an oval shape, but the embodiment is not limited thereto. Although the description has been made in that the second body 151 has the vertical outer surface S5, the second body 151 may have a curved surface such as a hemispherical shape. The outer surface having the shape of a curved surface can provide a wider light exit surface.

The width of the second body 151 may be smaller than the width W4 of the first body 141 as shown in FIG. 15. According to the embodiment, the width of the second body 151 may be equal to or greater than the width W4 of the first body 141. Accordingly, the contact area between the first and second bodies 141 and 151 is increased, thereby preventing moisture from being infiltrated into the interfacial surface between the first and second bodies 141 and 151 having different materials, so that the reliability of the package can be improved.

The second body 151 includes the second thermosetting resin representing the transmittance of 70% or more with respect to the wavelength emitted from the light emitting chip 161. The second thermosetting resin may include at least one selected from the group consisting of silicon-containing resin, transparent epoxy resin, modified epoxy resin, transparent silicon resin, modified silicon resin, acrylate resin, and urethane resin. In the second body 151, at least one selected from the group consisting of a filler, a diffusing agent, pigments, a phosphor material, and a reflective material may be mixed with the second thermosetting resin, so that the second body 151 has a predetermined function. In addition, the second thermosetting resin may contain a diffusing agent. For example, the diffusing agent may include barium titanate ($BaTiO_3$), titanium oxide ($TiO_2$), aluminum oxide ($Al_2O_3$) or silicon oxide ($SiO_2$).

As shown in FIGS. 20 and 21, the second body 151 has the first opening 150, and the first opening 150 may correspond to the central regions of the lead frames 121 and 131. The first opening 150 may have a width smaller than that of the opening 150-1 of the first body 141. An inner lateral side 152 of the second body 151 may be perpendicular to the top surface of the first lead frame 121 or the top surface of the second lead frame 131, or may be inclined at an angle of 90° to 180°.

The inner portion 152A of the second body 151 is closer to the light emitting chip 161 than the inner portion 148 of the first body 141, and may make contact with the top surfaces of the lead frames 121 and 131. In addition, the inner portion 152A of the second body 151 makes contact with the top surface of the first body 141, so that the adhesive strength between the inner portion 152A of the second body 151 and the first body 141 can be increased. The structure can effectively prevent moisture from being infiltrated.

The height (or thickness) of the inner lateral side 152 of the second body 151 may be thicker than the thickness of the light emitting chip 161, and may be formed higher than the high point of the wires 166 and 167 of FIG. 16. For example, the height of the inner lateral side 152 of the second body 151 may be formed in the range of 250 μm or 500 μm, but the embodiment is not limited thereto. When viewed from the top, in the opening 150, the length in the direction of an X axis may be different from the width in the direction of a Z axis or may be equal to the width in the direction of the Z axis, but the embodiment is not limited thereto.

As shown in FIG. 21, a concave-convex structure, a roughness structure, or a step structure may be formed at the upper portion of the second body 151. In addition, the second body 151 is provided thereon with a first protrusion 153 protruding from an inner upper portion thereof, a second protrusion 155 protruding from an outer upper portion thereof, and a third groove 154 formed between the first and second protrusions 153 and 155. The first and second protrusions 153 and 155 may protrude with the same height or different heights. The third groove 154 may be formed at the depth lower than that of the top surface of the first protrusion 153. The adhesive strength between the optical lens 2 and the second body 151 may be increased due to the first and second protrusions 153 and 155 and the third groove 154 formed at the upper portion of the second body 151 as shown in FIG. 16.

As shown in FIG. 16, one or at least two light emitting chips 161 may be provided on at least one of the first and second lead frames 121 and 131 exposed through the bottom of the first opening 150 of the first body 141.

The light emitting chip 161 may be provided on the first lead frame 121 and connected to the first lead frame 121 through a first wire 165. The light emitting chip 161 may be connected to the second lead frame 131 through a second wire 166. The light emitting chip 161 is driven by receiving power from the first and second lead frames 121 and 131.

According to another embodiment, the light emitting chip 161 may be die-bonded to the first lead frame 121, and may be connected to the second lead frame 131 through a wire. The light emitting chip 161 may be bonded to the first and second lead frames 121 and 131 through a flip-chip bonding scheme.

The light emitting chip 161 may include an LED chip including a semiconductor compound. The light emitting chip 161 may include at least one of an ultraviolet LED chip, a blue LED chip, a green LED chip, a white LED chip, and a red LED chip. The light emitting chip 161 may include a group III-V compound semiconductor. An active layer in the light emitting chip 161 may include at least one of a double bonding structure, a single well structure, a multiple well structure, a single quantum well structure (SQW), a multi quantum well (MQW) structure, a quantum wire structure, and a quantum dot structure. The active layer is provided by alternately providing well and barrier layers. The lamination structure of the well/barrier layers such as the lamination structure of InGaN/GaN, GaN/AlGaN, InGaN/AlGaN, InGaN/InGaN, or InAlGaN/InAlGaN may be formed at 2 to 30 cycles. In addition, the active layer may include a semiconductor such as ZnS, ZnSe, SiC, GaP, GaAlAs, AlN, InN, or AlInGaP, but the embodiment is not limited thereto. The light emission wavelength of the active layer may be selected from the range of an ultraviolet band wavelength to a visible band wavelength, but the embodiment is not limited thereto.

Referring to FIGS. 15, 17, and 18, a second opening 150A is formed at a region spaced apart from the first opening 150 of the second body 151. The second region of the first and second lead frames 121 and 131 correspond to the bottom of the second opening 150A. The first lead frame 121 is provided thereon with a protective device 163, and the protective device 163 is connected to the second lead frame 131 through a third wire 168. The first and second bodies 141 and 151 serve as separators between the first and second openings 150 and 150A. The thickness of the first body 141 provided between the first and second openings 150 and 150A may be equal to the thickness of the protective device 163 or may be thinner than or thicker than the thickness of the protective device 163. The thickness of the first body 141 may be formed with the thickness thicker than that of the protective device 163 by taking light loss into consideration. The peripheral portion of the second opening 150A may be perpendicular to the top surfaces of the lead frames 121 and 131 or inclined with respect to the top surfaces of the lead frames 121 and 131. Although the protective device 163 is provided in the second opening 150A, the protective device 163 may be provided at another region or may be omitted, but the embodiment is not limited thereto. The protective device 163 may be realized by using a thyristor, a Zener diode, or a transient voltage suppression (TVS). The Zener diode protects the light emitting chip 161 from electro static discharge (ESD).

The transparent resin layer 171 is formed in the first opening 150 of the second body 151. The transparent resin layer 171 may include a silicon resin material or an epoxy resin material. In detail, the transparent resin layer 171 may include a material representing at least 70% of transmittance, in detail, at least 90% of transmittance with respect to the wavelength (for example, blue wavelength) emitted from the light emitting chip 161.

The transparent resin layer 171 may have a flat top surface. According to another embodiment, the transparent resin layer 171 may have a concave top surface or a convex top surface.

The refractive index of the transparent resin layer 171 is 1.6 or less. The refractive index of the second body 151 may be equal to or lower than that of the transparent resin layer 171. In addition, the refractive index of the second body 151 may make the difference of about ±0.2 from the refractive index of the transparent resin layer 171, but the embodiment is not limited thereto.

The transparent resin layer 171 may include at least one of a filler, a diffusing agent, pigments, a phosphor material, and a reflective material. The phosphor material contained in the transparent resin layer 171 absorbs light emitted from the light emitting chip 161 to wavelength-convert the light to light having a different wavelength. The phosphorus material may include at least one of a yellow phosphor, a green phosphor, a blue phosphor and a red phosphor. For instance, the phosphorus material may include at least one selected from the group consisting of a nitride based phosphor, an oxy-nitride based phosphor and a sialon based phosphor, which are mainly activated by lanthanoid based elements, such as Eu or Ce; an alkali earth halogen apatite phosphor, which is mainly activated by a lanthanoid based element, such as Eu, or a transient metallic element, such as Mn; an alkali earth metal boric acid halogen phosphor; an alkali earth metal aluminate phosphor; an alkali earth silicate; an alkali earth sulfide; an alkali earth thio-gallate; an alkali earth silicon nitride; a germinate; a rare-earth aluminate mainly activated by a lanthanoid based element, such as Ce; a rare-earth silicate; and an organic chelating agent mainly activated by a lanthanoid based element, such as Eu, but the embodiment is not limited thereto.

As shown in FIG. 16, the optical lens 2 is provided on the transparent resin layer 171. The optical lens 2 may include a transparent resin material such as silicon or epoxy, or a glass material. The optical lens 2 may include a material representing a refractive index equal to or lower than the refractive index of the transparent resin layer 171. The optical lens 2 may be provided at the upper portion of the transparent resin layer 171 and the second body 151. An adhesive layer may be formed on the top surfaces of the first and second bodies 141 and 151 so that the top surfaces of the first and second bodies 141 and 151 adhere to each other.

The second exit surface 23 of the optical lens 2 is formed outward of the outer surface S5 of the second body 151, and may make contact with the top surface of the first body 141. The second exit surface 23 of the optical lens 2 covers the peripheral portion of the second body 151 to closely make contact with the outer surface of the second body 151, thereby adjusting the orientation angel of the second light L2 reflected by the first body 141 or the first light L1 transmitted through the second body 151.

The peripheral portion of the optical lens 2 may have a circular shape for the light distribution. When viewed from the top, the optical lens 2 may have a circular shape or an oval shape.

The recess portion 24 may be formed at the central portion of the top surface of the optical lens 2. The recess portion 24 corresponds to the light emitting chip 161, and has a depth lower than the top surface of the optical lens 2 in the direction of the light emitting chip 161. The recess portion 24 of the optical lens 2 totally reflects the light reflected from the top surface of the first body 141. When viewed from the top, the recess portion 24 may have a circular shape, or may have a hemispherical lower portion or a conical lower portion.

Referring to FIGS. 17 and 18, a portion 183 of the optical lens 2 may be filled in the second opening 150A, or another resin member may be formed in the second opening 150A, but the embodiment is not limited thereto.

Referring to FIGS. 15 and 16, the light emitted from the light emitting chip 161 of the light emitting device 100 is emitted in all directions. In this case, a portion of light transmitted through the transparent resin layer 171 is transmitted through the second body 151, and a remaining portion of the light is incident into the optical lens 2 through the top surface of the transparent resin layer 171. In addition, a portion of the light incident into the optical lens 2 is reflected through the total-reflection surfaces of the recess portion 24. The reflected light may be reflected by the top surface of the second body 151 or may be reflected by the top surface of the first body 141 when the light is transmitted through the second body 151. Therefore, according to the light emitting device 100, light can be emitted substantially horizontally by the first body 141 provided lower than the top surface of the light emitting chip 161. In addition, as shown in FIG. 22, as the angle θ5 is increased, the light orientation angle is more increased. As the angle θ5 is reduced, the light orientation angle is more reduced. Accordingly, the light orientation angle can be adjusted according to the inclined surface or the thickness of the first body 141.

[Fabrication Method of Light Emitting Device]

As shown in FIGS. 19 and 20, the first body 141 is injection-molded on the lead frames 121 and 131 through a molding scheme using a resin material representing high reflectance. If the first body 141 is formed as shown in FIG. 21, the transparent second body 151 is injection-molded through a transfer molding scheme, or an injection molding scheme using a resin material representing high transmittance. In addition, as shown in FIGS. 15 and 16, the light emitting chip 161 and the protective device 163 are mounted on the lead frames 121 and 131 exposed through the first opening 150 provided in the second body 151, and the light emitting chip 161 is electrically connected to the lead frames 121 and 131 by using wires 165, 166, and 168. In addition, the transparent resin layer 171 is formed in the first opening 150 of the second body 151 through a dispensing process or a molding scheme, and a phosphor material may be contained in the transparent resin layer 171. The optical lens 2 is coupled with the top surface of the transparent resin layer 171. The optical lens 2 may be injection-molded through a transfer molding scheme or may be attached through an adhesive scheme. Another resin layer may be additionally formed between the transparent resin layer 171 and the optical lens 2, but the embodiment is not limited thereto. An adhesive layer may be formed on the top surfaces of the first and second bodies 131 and 141, but the embodiment is not limited thereto.

Figure 23:
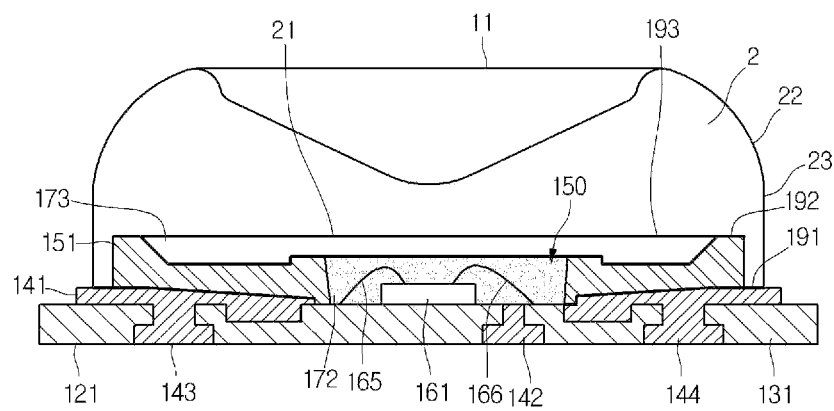
FIG. 23 is a side sectional view showing a light emitting device according to the seventh embodiment.

FIG. 23 is a sectional view showing a light emitting device according to the seventh embodiment. In the following description of the seventh embodiment, since the components and the structure the same as those of the sixth embodiment can be understood by making reference to the sixth embodiment, the details thereof will be omitted in order to avoid redundancy.

Referring to FIG. 23, a light emitting device includes the lead frames 121 and 131, the first body 141, the second body 151, the first transparent resin layer 172, and a second transparent resin layer 173, and the optical lens 2.

The first transparent resin layer 172 may correspond to the transparent resin layer of FIG. 16, and may be contained therein with a phosphor material. The second transparent resin layer 173 is provided among the second body 151, the first transparent resin layer 172, and the optical lens 2.

The top surface of the second transparent resin layer 173 may be provided horizontally to the top surface of the second body 151. In this case, the coupling force with the optical lens 2 attached onto the second transparent resin layer 173 can be improved.

At least one of the first and second transparent resin layers 172 and 173 may include at least one of a filler, a diffusing agent, pigments, a phosphor material, and a reflective material. The phosphor material is contained in the first transparent resin layer 172, and the second transparent resin layer 173 does not contain the phosphor material. In addition, the first and second transparent resin layers 172 and 173 may include phosphor materials emitting different wavelengths, but the embodiment is not limited thereto.

A first adhesive layer 191 is formed between the first body 141 and the second body 151 to bond the first and second bodies 141 and 151, which include different resin materials, to each other. A second adhesive layer 192 may be formed between the second body 151 and the second transparent resin layer 173 to bond the second body 151 to the second transparent resin layer 173. A third adhesive layer 193 may be formed on the top surface of the second transparent resin layer 173 to improve the adhesive strength between the second transparent resin layer 173 and the optical lens 2.

The first to third adhesive layers 191, 192, and 193 include a resin material such as silicon or epoxy to improve the adhesive strength. The thicknesses of the first to third adhesive layers 191, 192, and 193 may be formed in the range of 1 μm to 10 μm.

The first adhesive layer 191 may contain reflective metal or a scattering agent in order to improve the reflection efficiency. The second and third adhesive layers 192 and 193 may contain a diffusing agent or a phosphor, but the embodiment is not limited thereto.

Figure 24:
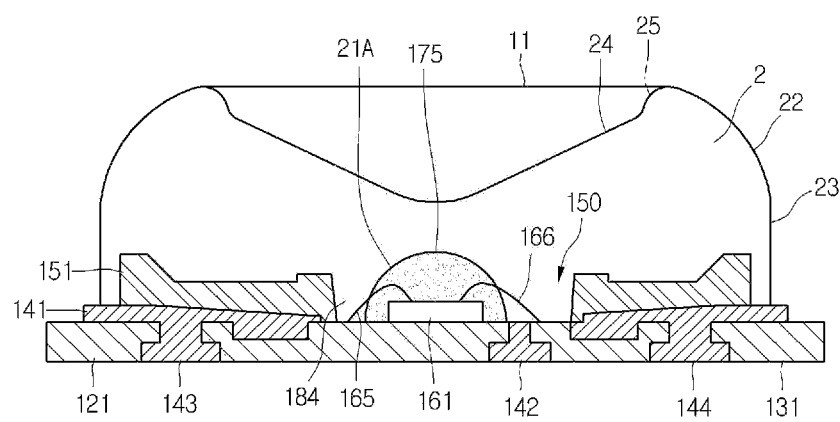
FIG. 24 is a side sectional view showing a light emitting device according to the eighth embodiment.

FIG. 24 is a side sectional view showing a light emitting device according to the eighth embodiment. In the following description of the eighth embodiment, since the components and the structure the same as those of the sixth embodiment can be understood by making reference to the sixth embodiment, the details thereof will be omitted in order to avoid redundancy.

Referring to FIG. 24, according to the light emitting device, the first opening 150 in the body 151 is provided therein with a transparent resin layer, for example, a phosphor layer 175. The phosphor layer 175 may have a hemispherical shape. The phosphor layer 175 may be provided around the light emitting chip 161 while maintaining the substantially uniform distance from the center of the light emitting chip 161, so that the distribution of light having converted wavelengths can be uniformly adjusted. The top surface of the phosphor layer 175 may protrude beyond the top surface of the second body 151. The width of the bottom surface of the phosphor layer 175 may be wider than the width of the light emitting chip 161, and may be narrower than the interval between the first and second wires 166 and 167.

The first opening 150 of the second body 151 may be filled with a portion 184 of the optical lens 2 or another resin member. The material filled in the first opening 150 may make contact with the phosphor layer 175. The second body 151 having high transmittance is provided around the light emitting chip 161, so that the first light emitted from the light emitting chip 161 and the second light having a wavelength converted by the phosphor layer 175 are emitted with the light orientation angle of 130° or more.

Figure 25:
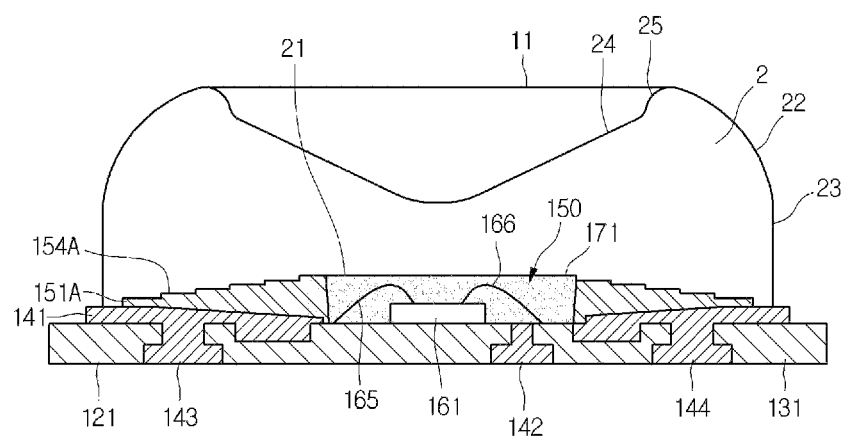
FIG. 25 is a side sectional view showing a light emitting device according to the ninth embodiment.

FIG. 25 is a side sectional view showing a light emitting device according to the ninth embodiment. In the following description of the ninth embodiment, since the components and the structure the same as those of the sixth embodiment can be understood by making reference to the sixth embodiment, the details thereof will be omitted in order to avoid redundancy.

Referring to FIG. 25, according to the light emitting device, a step structure may be formed at an upper portion 154A of the second body 151 having high transmittance. The thickness of the upper portion 154A of the second body 151 may be gradually reduced from an outer portion of the upper portion 154A to an inner portion of the upper portion 154A. The upper portion 154A of the second body 151 has the step structure, so that the contact area between the upper portion 154A and the optical lens 2 can be increased, and the adhesive strength between the upper portion 154A and the optical lens 2 can be improved.

In addition, the thickness of the second body 151 is reduced from the inner portion thereof toward the outer portion thereof so that the second body 151 can support the optical lens 2 and the first body 141 between the optical lens 2 and the first body 141 and can transmit the light emitted from the light emitting chip 161.

Figure 26:
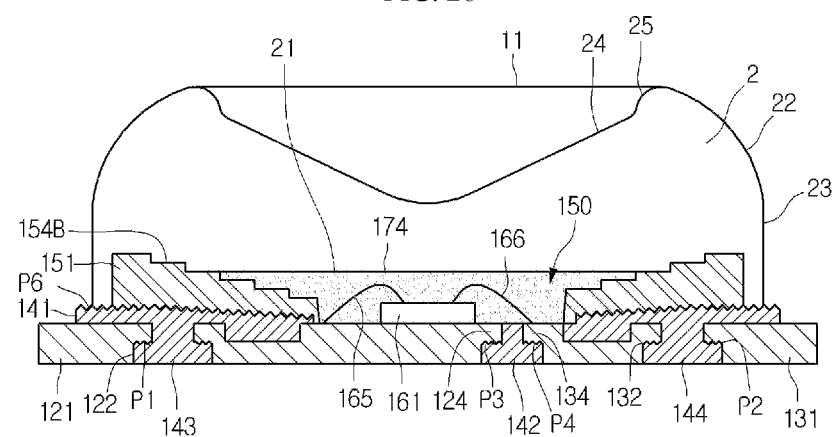
FIG. 26 is a side sectional view showing a light emitting device according to the tenth embodiment.

FIG. 26 is a side sectional view showing a light emitting device according to the tenth embodiment. In the following description of the tenth embodiment, since the components and the structure the same as those of the sixth embodiment can be understood by making reference to the sixth embodiment, the details thereof will be omitted in order to avoid redundancy.

Referring to FIG. 26, the light emitting device may include the first and second lead frames 121 and 131 having first to fourth concave-convex patterns P1, P2, P3, and P4. The first and second concave-convex patterns P1 and P2 are formed on the stepped bottom surface of the first lead frame 121 and the stepped bottom surface of the second lead frame 131 to increase the contact area with the first and second coupling parts 143 and 144. Accordingly, moisture can be prevented from being infiltrated into the space between the first body 141 and the lead frames 121 and 131.

In addition, the third and fourth concave-convex patterns P3 and P4 are formed on the bottom surface of the first end portion 124 of the first lead frame 121 and the bottom surface of the second end portion 134 of the second lead frame 131, so that the contact area with the separation part 142 can be increased. Accordingly, moisture can be prevented from being infiltrated into the space between the first body 141 and the lead frames 121 and 131.

According to another embodiment, another concave-convex pattern is additionally formed on the top surfaces of the first and second lead frames 121 and 131, so that the contact between the first and second lead frames 121 and 131 and the first body 141 can be enhanced, and moisture infiltration can be prevented.

The fifth concave-convex pattern P6 is formed on the top surface of the first body 141 to increase the contact area between the outer sidewall 23 of the optical lens 2, and the second body 151 and prevent moisture infiltration.

An upper portion 154B of the second body 151 may be formed in a step structure having the height reduced from the outer portion of the upper portion 154B toward the inner portion of the upper portion 154B. The transparent resin layer 174 may be formed from the upper portion 154B of the second body 151 to the inner region of the second body 151, but the embodiment is not limited thereto.

Figure 27:
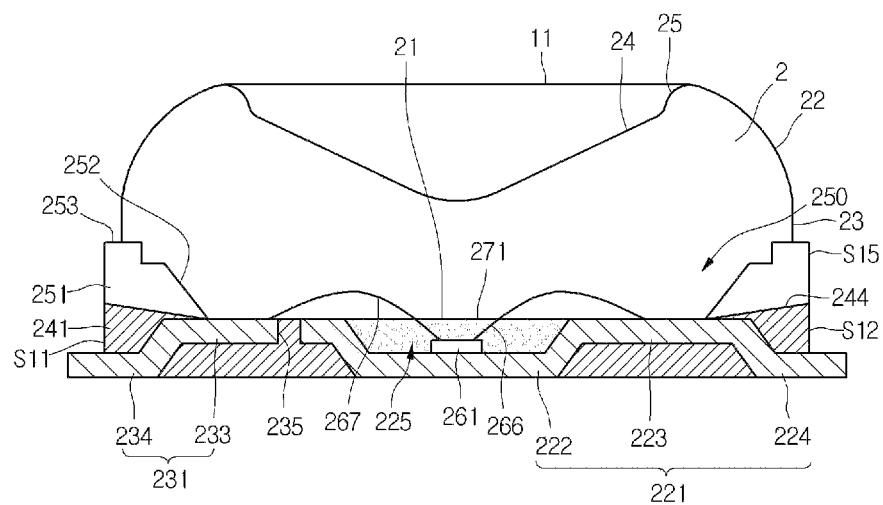
FIG. 27 is a side sectional view showing a light emitting device according to the eleventh embodiment.

FIG. 27 is a side sectional view showing a light emitting device according to the eleventh embodiment. In the following description of the eleventh embodiment, since the components and the structure the same as those of the sixth embodiment can be understood by making reference to the sixth embodiment, the details thereof will be omitted in order to avoid redundancy.

Referring to FIG. 27, the light emitting device includes a first lead frame 221, a second lead frame 231, a first body 241, a second body 251, a transparent resin layer 271, and the optical lens 2.

The first lead frame 221 includes a heat radiation part 222 having a cavity 225, a first connection part 223, and a first lead part 224. The first lead frame 221 may include at least one of a hole and a groove for the purpose of coupling with the first body 241, but the embodiment is not limited thereto. A light emitting chip 261 is provided on the bottom of the cavity 225 of the heat radiation part 222. The lateral side of the cavity 225 is perpendicular to the bottom surface of the first body 241 or inclined at an angle of 90° or more with respect to the bottom surface of the first body 241 to reflect the light from the light emitting chip 261. The heat radiation part 222 may radiate the heat emitted from the light emitting chip 261 through a substrate or a heat radiation plate provided at the lower portion thereof.

The second lead frame 231 includes a second connection part 233 and a second lead part 234. The second lead frame 231 may include a hole 235, and a portion of the first body 241 may be provided in the hole 235. The first connection part 223 of the first lead frame 221 and the second connection part 233 of the second lead frame 231 are exposed through the first opening 250 of the second body 251. A cavity 255 is provided at the central portion of the first opening 250.

The first connection part 223 of the first lead frame 221 and the second connection part 233 of the second lead frame 231 are exposed through the top surface of the first body 241. The light emitting chip 261 may be connected to the first connection part 223 through a first wire 266, and may be connected to the second connection part 233 through a second wire 267.

The first lead part 224 of the first lead frame 221 may be bent from the first connection part 223 and exposed to the bottom surface of the first body 241 through the first body 241. The first lead part 224 may protrude beyond the second lateral side S12 of the first body 241.

The second lead part 234 of the second lead frame 231 is bent from the second connection part 233 and exposed to the bottom surface of the first body 241 in the first body 241. A portion of the second lead part 234 may protrude beyond the first lateral side S11 of the first body 241.

An outer portion of the top surface 244 of the first body 241 may be inclined, and the internal angle of the outer portion of the top surface 244 may be formed in the range of 140° to 170°.

A second body 251 representing high transmittance is provided at a peripheral portion of the top surface of the first body 241. The second body 251 transmits the light incident thereto to widen the light orientation angle. An inner lateral side 252 of the second body 251 may be inclined, but the embodiment is not limited thereto.

A transparent resin layer 271 is formed in the cavity 255. The transparent resin layer 271 may include a resin material such as silicon or epoxy. The transparent resin layer 271 may include at least one of a filler, a diffusing agent, pigments, a phosphor material, and a reflective material.

An upper portion 253 of the second body 251 has a step structure, and the step structure may be coupled with the outer sidewall 23 of the optical lens 2. The optical lens 2 is provided at the central portion thereof with the recess portion 24. The bottom surface of the optical lens 2 may make contact with the top surface of the transparent resin layer 271, or may be spaced apart from the top surface of the transparent resin layer 271. In addition, another resin layer may be additionally provided between the optical lens 2 and the transparent resin layer 271, but the embodiment is not limited thereto.

Wires 266 and 267 are provided in the first opening 250 of the second body 251, or another resin layer may be formed in the first opening 250. The outer lateral side S15 of the second body 251 may be formed in line with the outer lateral sides S11 and S12 of the first body 241, but the embodiment is not limited thereto.

Figure 28:
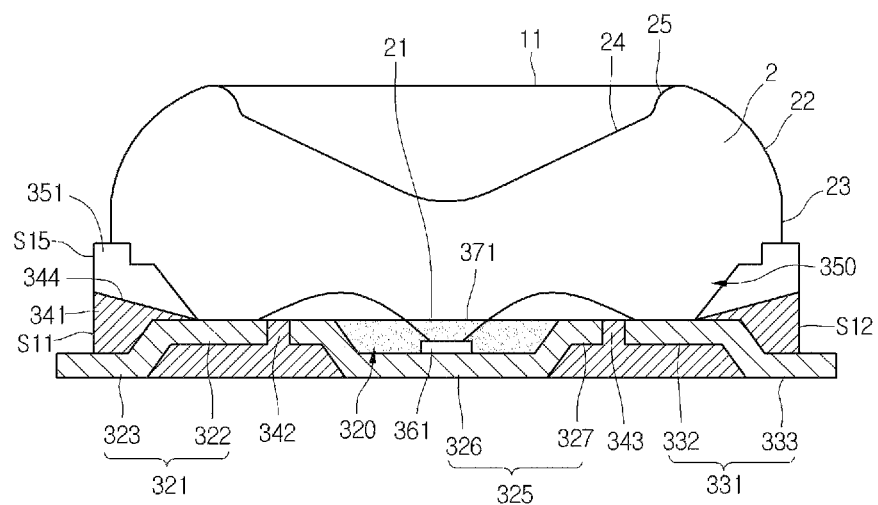
FIG. 28 is a side sectional view showing a light emitting device according to the twelfth embodiment.

FIG. 28 is a side sectional view showing a light emitting device according to the twelfth embodiment. In the following description of the twelfth embodiment, since the components and the structure the same as those of the sixth embodiment can be understood by making reference to the sixth embodiment, the details thereof will be omitted in order to avoid redundancy.

Referring to FIG. 28, the light emitting device includes first and second lead frames 321 and 331, a third lead frame 325 between the first and second lead frames 321 and 331, a transparent resin layer 371 on the third lead frame 325, a first body 341 to support the first to third lead frames 321, 331, and 325, a second body 351 provided on the first body 341 and representing transmittance higher than that of the first body 341, and the optical lens 2 on the transparent resin layer 371.

The first lead frame 321 is interposed between a first lateral side S11 of the first body 341 and the third lead frame 325, and includes a first connection part 322 and a first lead part 323. The first connection part 322 is exposed to the top surface of the first body 341 and connected to a light emitting chip 361 through a first wire 366. The first lead part 323 is bent or extends from the first connection part 322 in the first body 341 and provided on the bottom surface of the first body 341 while protruding in the direction of the first lateral side S11 of the first body 341.

The second lead frame 331 is interposed between a second lateral side S12 of the first body 341 and the third lead frame 325, and includes a second connection part 332 and a second lead part 333. The second connection part 332 is exposed to the top surface of the first body 341 and connected to the light emitting chip 361 through a second wire 367. The second lead part 333 is bent in the first body 341 and extends to the bottom surface of the first body 341 while protruding in the direction of the second lateral side S12 of the first body 341.

The third lead frame 325 includes a heat radiation part 326 having a cavity 320 and a support part 327 bent from the heat radiation part 326. The light emitting chip 361 is provided on the bottom of the cavity 320. The bottom surface of the heat radiation part 326 may be exposed to the bottom surface of the first body 341. The support part 327 may be exposed to the top surface of the first body 341, but the embodiment is not limited thereto. The heat radiation part 326 may radiate haet emitted from the light emitting chip 361 through a substrate or a heat radiation plate provided at the lower portion of the heat radiation part 326.

The first body 341 includes a first separation part 342 between the first and third lead frames 321 and 331, and a second separation part 343 between the third and second lead frames 325 and 331.

The first connection part 322 of the first lead frame 321 and the second connection part 332 of the second lead frame 331 are exposed through a first opening 350 of the second body 351. A cavity 320 is provided at the central portion of the first opening 350 of the second body 351.

The light emitting chip 36 is provided on the bottom of the cavity 320. The light emitting chip 361 is connected with the first connection part 322 of the first lead frame 321 through the first wire 366, and connected with the second connection part 332 of the second lead frame 321 through the second wire 367.

The transparent support layer 371 is formed in the cavity 320. The transparent support layer 371 may be formed horizontally to the top surface of the first body 341, but the embodiment is not limited thereto. The transparent resin layer 371 may include a resin material such as silicon or epoxy. The transparent resin layer 371 may include at least one of a filler, a diffusing agent, pigments, a phosphor material, and a reflective material.

The first body 341 corresponds to the first body according to the fifth embodiment. The outer portion of the top surface 344 may be inclined. The internal angle of the inclined surface of the first body 341 may be formed in the range of 135° to 180°.

The second body 351 corresponds to the second body according to the fifth embodiment. The first opening 350 formed in the second body 351 may have a width wider than that of the top surface of the cavity 320, but the embodiment is not limited thereto.

The top surface of the light emitting chip 361 may be lower than the top surface of the first body 341, but the embodiment is not limited thereto. The light emitted from the light emitting chip 361 may be reflected by the recess portion 24 of the optical lens 2, and the reflected light may be reflected by the top surface and the inclined surface of the first body 341. The light incident into the second body 351 is transmitted, so that the light orientation angle can be widened.

The outer sidewall 23 of the optical lens 2 may be provided inward of the lateral side S15 of the second body 351, but the embodiment is not limited thereto.

According to another embodiment, the top surface of the light emitting chip 361 may be exposed to the top surface of the first body 341. In this case, the light emitted from the light emitting chip 361 is reflected by the top surface and the inclined surface of the first body 341, or transmitted through the second body 351. Accordingly, the orientation angle of the light can be more widened. The depth of the cavity 320 may vary depending on the bending degree of the heat radiation part 326 of the third lead frame 325, and may be adjusted.

Figure 29:
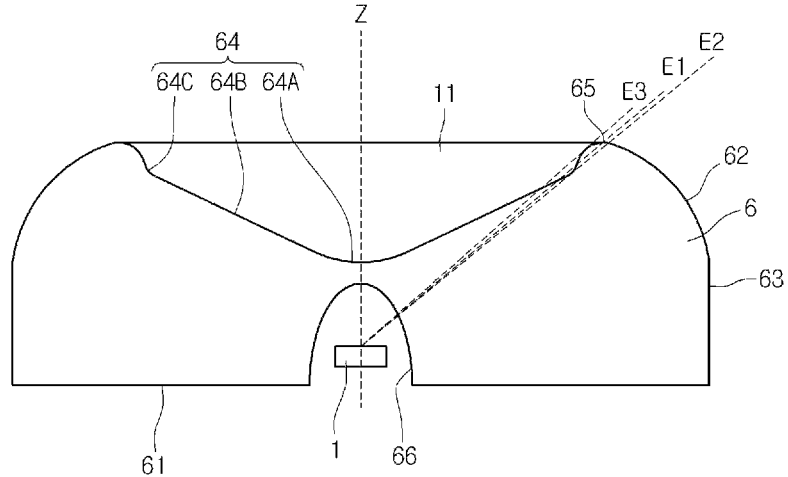
FIG. 29 is a side sectional view showing a light emitting device according to the thirteenth embodiment.

FIG. 29 is a sectional view showing a light emitting device according to the thirteenth embodiment. In the following description of the thirteenth embodiment, since the components and the structure the same as those of the sixth embodiment can be understood by making reference to the sixth embodiment, the details thereof will be omitted in order to avoid redundancy.

Referring to FIG. 29, the light emitting chip 1 is spaced apart from a recess part 66 provided in a light incident surface 61 of an optical lens 6 while being provided horizontally to the light incident surface 61. The recess part 66 has a hemispherical shape which is convexly recessed in the direction of the recess part 64. The structure of the optical lens 6 includes a recess portion 64, a convex portion 65, and exit surfaces 62 and 63, and the details thereof will be understood by making reference to the structure according to the second to fourth embodiments. The recess part 66 diffuses light emitted from the light emitting chip 1 to allow the light to be incident into the optical lens 6. The optical lens 6 reflects the incident light in a lateral direction by total-reflection surfaces 64A, 64B, and 64C of the recess portion 64 to improve the light orientation angle. The light emitting chip 1 may be provided in the recess part 66 provided upward of the incident surface 61 of the optical lens 6, but the embodiment is not limited thereto.

Figure 30:
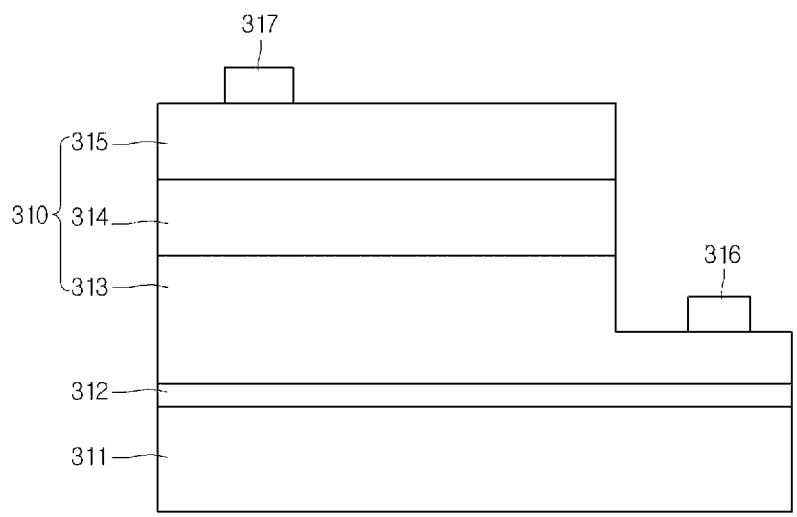
FIG. 30 is a sectional view showing one example of a light emitting chip in a light emitting device according to the embodiment.

FIG. 30 is a side sectional view showing one example of the light emitting chip according to the embodiment.

Referring to FIG. 30, the light emitting chip includes a substrate 311, a buffer layer 312, a light emitting structure 310, a first electrode 316, and a second electrode 317. The substrate 311 may include a substrate including a transmissive material or a non-transmissive material, and may include a conductive substrate or an insulating substrate.

The buffer layer 312 reduces the lattice constant difference between the materials constituting the substrate 311 and the light emitting structure 310, and may include a nitride semiconductor. A nitride semiconductor layer, which is not doped with dopants, is further disposed between the buffer layer 312 and the light emitting structure 310, so that the crystal quality can be improved.

The light emitting structure 310 includes a first conductive semiconductor layer 313, an active layer 314, and a second conductive semiconductor layer 315.

The first conductive semiconductor layer 313 may include the group III-V compound semiconductor doped with the first conductive dopant. For example, the first conductive semiconductor layer 313 may include the semiconductor material having the compositional formula of InxAlyGa1-x-yN (0≤x≤1, 0≤y≤1, 0≤x+y≤1). In detail, the first conductive semiconductor layer 313 may include the stack structure of layers including one selected from the group consisting of GaN, InN, AlN, InGaN, AlGaN, InAlGaN, AlInN, AlGaAs, GaP, GaAs, GaAsP, and AlGaInP. If the first conductive semiconductor layer 313 is an n type semiconductor layer, the first conductive dopant includes the n type dopant such as Si, Ge, Sn, Se, or Te.

A first clad layer may be formed between the first conductive semiconductor layer 313 and the active layer 314. The first clad layer may include a GaN-based semiconductor, and the bandgap of the first clad layer may be equal to or greater than the bandgap of the active layer 314. The first clad layer has the first conductive type, and confines carriers.

The active layer 314 is disposed on the first conductive semiconductor layer 313, and includes a single quantum well structure, a multiple quantum well (MQW) structure, a quantum wire structure or a quantum dot structure. The active layer 314 has the cycle of the well and barrier layers. The well layer may have the composition formula of InxAlyGa1-x-yN (0≤x≤1, 0≤y≤1, 0≤x+y≤1), and the barrier layer may have the composition formula of InxAlyGa1-x-yN (0≤x≤1, 0≤y≤1, 0≤x+y≤1). At least one cycle of the well/barrier layers may be used through the stack structure of InGaN/GaN, GaN/AlGaN, InGaN/AlGaN, InGaN/InGaN, InAlGaN/AlGaN and InAlGaN/InAlGaN. The barrier layer may include a semiconductor material having the bandgap higher than the bandgap of the well layer.

The second conductive layer 315 is formed on the active layer 314. The second conductive layer 315 includes a semiconductor doped with second conductive dopants, for example, includes a semiconductor having the composition formula of InxAlyGa1-x-yN (0≤x≤1, 0≤y≤1, 0≤x+y≤1). In detail, the second conductive semiconductor layer 315 may include one selected from compound semiconductors such as GaN, InN, AlN, InGaN, AlGaN, InAlGaN, AlInN, AlGaAs, GaP, GaAs, GaAsP, and AlGaInP. If the second conductive semiconductor layer 315 is a p type semiconductor layer, the semiconductor conductive dopant includes the p type dopant such as Mg, Zn, Ca, Sr, or Ba.

The second conductive semiconductor layer 315 may include a superlattice structure, and the superlattice structure may include an InGaN/GaN superlattice structure or am AlGaN/GaN superlattice structure. The superlattice structure of the second conductive semiconductor layer 315 abnormally spreads the current, thereby protecting the active layer 314.

In addition, the light emitting structure 310 may have an opposite conductive type. For example, the first conductive semiconductor layer 313 may include a P type semiconductor layer, and the second conductive semiconductor layer 315 may include an N type semiconductor layer. The second conductive semiconductor layer 315 may be disposed thereon with a first conductive semiconductor layer having the polarity opposite to the second conductive type polarity.

The light emitting structure 310 may be realized by using one of an n-p junction structure, a p-n junction structure, an n-p-n junction structure, and a p-n-p junction structure. The "p" represents a p type semiconductor, the "n" represents an n type semiconductor layer, and the "-" represents that the p type semiconductor is directly or indirectly connected to the n type semiconductor. Hereinafter, a case that the uppermost layer of the light emitting structure 310 is the second conductive semiconductor layer 315 will be described for the convenience of explanation.

The first electrode 316 is disposed on the first conductive semiconductor layer 313, and the second electrode 317 having a current spreading layer is disposed on the second conductive semiconductor layer 315. The first and second electrodes 316 and 317 are connected to each other through a wire, or through another connection scheme.

Figure 31:
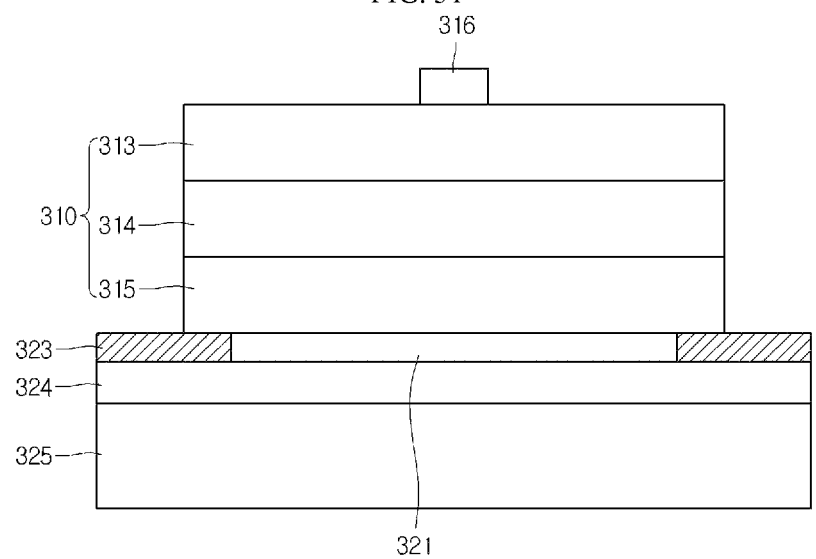
FIG. 31 is a sectional view showing another example of a light emitting chip in a light emitting device according to the embodiment.

FIG. 31 is a graph showing another example of the light emitting chip according to the embodiment. Hereinafter, in the following description of the embodiment, the details of the same parts as that of FIG. 30 will be omitted except for brief description.

Referring to FIG. 31, in a light emitting chip according to the embodiment, a contact layer 321 is formed under a light emitting structure 310, a reflective layer 324 is formed under the contact layer 321, a support member 325 is formed under the reflective layer 324, and a protective layer 323 may be formed around the reflective layer 324 and the light emitting structure 310.

One or a plurality of first electrodes 316 may be formed on the light emitting structure 310, and the first electrode 316 includes a pad bonded to a wire.

The light emitting chip may be formed by removing a growth substrate after forming a contact layer 321, a protective layer 323, a reflective layer 324, and a support member 323 under the second conductive semiconductor layer 315.

The contact layer 321 may make ohmic-contact with a lower layer of the light emitting structure 310, for example, the second conductive semiconductor layer 315, and may include a metallic oxide, a metallic nitride, an insulating material, or a conductive material. For example, the contact layer 321 may include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. The contact layer 321 may be formed in a multi-layer structure by using a metallic material and a transparent material such as IZO, IZTO, IAZO, IGZO, IGTO, AZO, or ATO. For example, the contact layer 321 may have the stack structure of IZO/Ni, AZO/Ag, IZO/Ag/Ni, or AZO/Ag/Ni. A layer to block current may be further formed in the contact layer 321 corresponding to the electrode 316.

The protective layer 323 may include a metallic oxide or an insulating material. For example, the protective layer 323 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SiO2, SiOx, SiOxNy, Si3N4, Al2O3, or TiO2. The protective layer 323 may be formed through a sputtering scheme or a deposition scheme. The metal constituting the reflective layer 324 may prevent the layers of the light emitting structure 310 from being shorted.

The reflective layer 324 may include metal such as Ag, Ni, Al, Rh, Pd, Ir, Ru, Mg, Zn, Pt, Au, Hf, or the selective combination thereof. The reflective layer 324 may have a width greater than the width of the light emitting structure 310, thereby improving the light reflection efficiency. A metallic layer for bonding and a metallic layer for thermal diffusion may be further disposed between the reflective layer 324 and the support member 325, but the embodiment is not limited thereto.

The support member 325 serves as a base substrate, and may include metal such as Cu, Au, Ni, Mo, or Cu—W, and a carrier wafer, such as Si, Ge, GaAs, ZnO, and SiC. An adhesive layer may be further formed between the support member 325 and the reflective layer 324, and bonds the two layers to each other. The disclosed light emitting chip is four the illustrative purpose, and the embodiment is not limited thereto. The light emitting chip may be selective applied to the light emitting device according to the embodiment, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 31 and 32, a lighting apparatus shown in FIG. 33, a lighting lamp, a camera flash, a signal lamp, a headlamp for a vehicle, and an electronic display.

Figure 32:
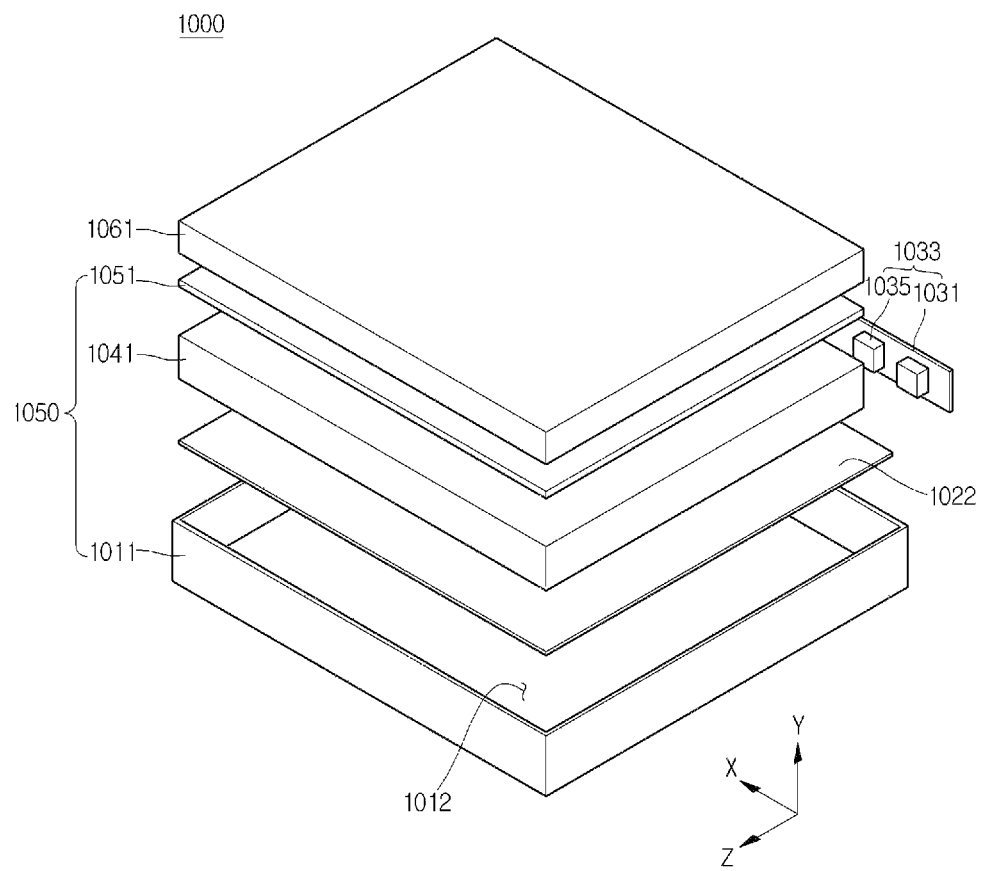
FIG. 32 is a perspective view showing a display apparatus having the light emitting device according to the embodiment.

FIG. 32 is an exploded perspective view showing a display apparatus having the light emitting device according to the embodiment.

Referring to FIG. 32, a display apparatus 1000 according to the embodiment includes a light guide plate 1041, a light source module 1033 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1033, and the reflective member 1022, but the embodiment is not limited thereto.

The bottom cover 1011, the reflective sheet 1022, the light guide plate 1041, the optical sheet 1051, and the light unit 1050 may be defined as a backlight unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light source module 1033 is disposed on at least one side of the light guide plate 1041 to supply the light to at least one side of the light guide plate 1041. The light source module 1033 serves as the light source of the display device.

At least one light source module 1033 is disposed to directly or indirectly supply the light from one side of the light guide plate 1041. The light source module 1033 may include a board 1031 and the light emitting device according to the embodiments or the light emitting device 1035. The light emitting device or the light emitting device 1035 are arranged on the board 1031 while being spaced apart from each other at the predetermined interval.

The board 1031 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1031 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1031, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1033, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 103 as optical members, but the embodiment is not limited thereto.

Figure 33:
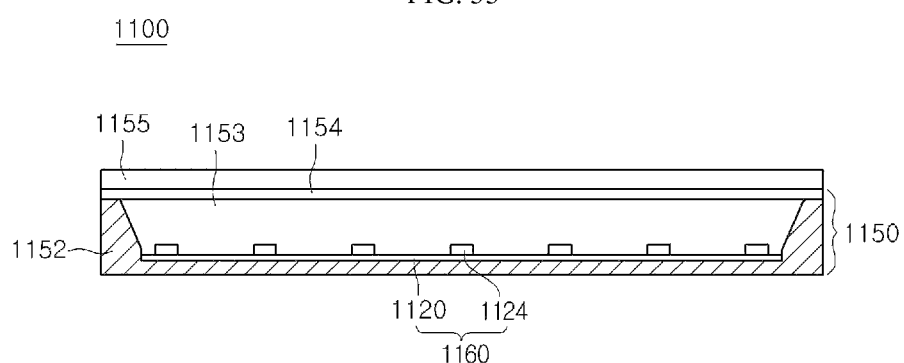
FIG. 33 is a sectional view showing a display apparatus according to the embodiment.

FIG. 33 is a sectional view showing a display apparatus according to the embodiment.

Referring to FIG. 33, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1151 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 34:
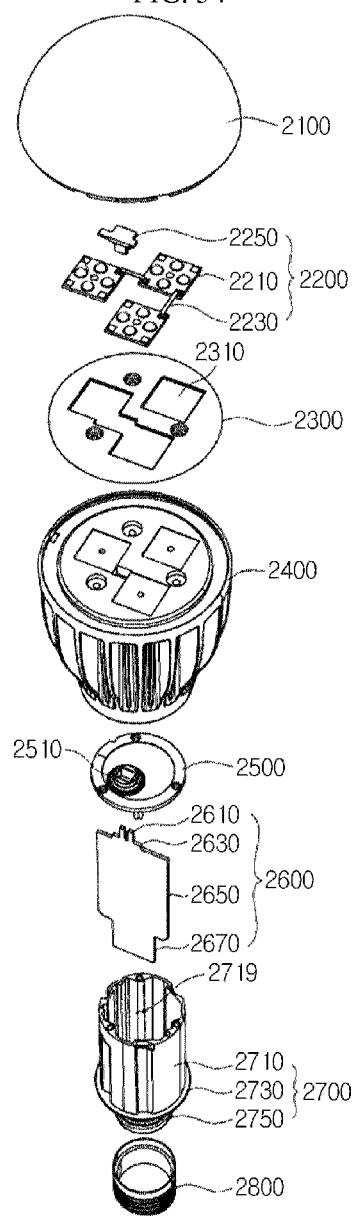
FIG. 34 is an exploded perspective view showing a lighting device having the light emitting device according to the embodiment.

FIG. 34 is an exploded perspective view showing a lighting device having the light emitting device according to the embodiment.

Referring to FIG. 34, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The embodiment can provide an optical lens having a wide light orientation angle. The orientation angle of the light emitted from a light emitting chip can be widened by using the optical lens. The embodiment can provide a dam structure capable of preventing a reflective member, which is filled in the recess portion of the optical lens, from being provided beyond the recess portion. Accordingly, foreign matters can be prevented from being produced on the exit surface of the optical lens. According to the embodiment, the product yield of the optical lens can be improved, so that the optical reliability of the optical lens can be improved.

According to the embodiment, the reliability of the light emitting device and the lighting device having the same can be improved.

According to the embodiment, the distribution of the light orientation angle of the light emitting device having the optical lens can be improved. According to the embodiment, the optical lens is applicable to a lighting lamp, a signal lamp, the headlamp of a vehicle, and an electronic display having a light emitting device mounted thereon. According to the embodiment, the reliability of the light emitting device having the optical lens and a lighting device having the light emitting device can be improved. The embodiment can provide an optical lens having a dam for a reflective member to reflect light in a light exit region.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An optical lens comprising:
a bottom surface;
a recess part at a center region of the bottom surface;
a light exit surface provided opposite to the bottom surface and having a convex curved surface;
an outer sidewall connected between an edge of the bottom surface and a lower portion of the light exit surface;
a recess portion provided opposite to the bottom surface and recessed toward the bottom surface; and
a convex portion provided between the recess portion and the light exit surface,
wherein the recess part is concave in a direction toward the recess portion from the bottom surface,
wherein the recess portion includes a first total-reflection surface having a first concave curved surface at a center region of the recess portion, a second total-reflection surface that extends from the first total-reflection surface, a third total-reflection surface having a second concave curved surface that extends from the second total-reflection surface,
wherein the first concave curved surface of the first total-reflection surface corresponds to the recess part,
wherein the second total-reflection surface is disposed between the first total-reflection surface and the third total-reflection surface,
wherein the convex portion is provided between a inflection point and an apex of the light exit surface,
wherein the first total-reflection surface, the second total-reflection surface and the third total-reflection surface have curvatures different from each other,
wherein the apex of the light exit surface is connected to a portion of the convex portion,
wherein the convex portion is connected to the third total-reflection surface at the inflection point,
wherein the third total-reflection surface is concave between the second total-reflection surface and the convex portion, and
wherein the third total-reflection surface and the convex portion have surfaces curved in opposite directions to each other about the inflection point.

2. The optical lens of claim 1, wherein the convex portion is provided more inward than the apex of the light exit surface.

3. The optical lens of claim 1, wherein the apex of the convex portion is provided more upward than the apex of the light exit surface.

4. The optical lens of claim 1, wherein the convex portion has a curvature smaller than a curvature of the first concave curved surface, and
wherein the curvature of the convex portion is greater than a curvature of the third total-reflection surface.

5. The optical lens of claim 1, wherein an apex of the convex portion is the apex of the light exit surface, and
wherein a curvature of the convex portion is smaller than a curvature of the third total-reflection surface.

6. The optical lens of claim 5, wherein a height of the convex portion is a range of 0.15 mm to 0.19 mm.

7. The optical lens of claim 1, wherein a depth of the recess portion is a range of 65% to 75% of a thickness of the optical lens.

8. The optical lens of claim 1, wherein a thickness of a central portion between the bottom surface and the recess part is a range of 25% to 35% of a thickness of the optical lens.

9. The optical lens of claim 1, wherein a curvature of the first total-reflection surface is smaller than a curvature of the second total-reflection surface.

10. The optical lens of claim 9, wherein the curvature of the first total-reflection surface is greater than the curvature of the third total-reflection surface.

11. The optical lens of claim 9, wherein a curvature of the convex portion is at least two times smaller than the curvature of the first total-reflection surface.

12. The optical lens of claim 11, wherein the curvature of the first total-reflection surface is in a range of 1 mm to 2 mm.

13. The optical lens of claim 9, wherein the outer sidewall has a vertical surface from the bottom surface.

14. An optical lens comprising:
a bottom surface;
a recess part at a center region of the bottom surface;
a light exit surface provided opposite to the bottom surface and having a convex curved surface;
an outer sidewall connected between the bottom surface and the light exit surface;
a recess portion provided opposite to the bottom surface and recessed toward the bottom surface; and
a convex portion provided between the recess portion and the light exit surface,
wherein the recess part is concave in a direction toward the recess portion,
wherein the recess portion includes a first total-reflection surface having a first concave curved surface at a center region of the recess portion, a second total-reflection surface that extends from the first total-reflection surface, a third total-reflection surface having a second concave curved surface that extends from the second total-reflection surface,
wherein the first concave curved surface of first total-reflection surface corresponds to the recess part,
wherein the second total-reflection surface is disposed between the first total-reflection surface and the third total-reflection surface,
wherein the convex portion is between a first inflection point and an apex of the light exit surface,
wherein the first total-reflection surface, the second total-reflection surface and the third total-reflection surface have curvatures different from each other,
wherein the outer sidewall is connected between a second inflection point of the light exit surface and an edge of the bottom surface, and has a linear contour,
wherein a position of the second inflection point is located on a virtual horizontal line that is lower than a position of a low point of the recess portion,
wherein the apex of the light exit surface is connected to a portion of the convex portion,
wherein the convex portion is connected to the third total-reflection surface at the first inflection point,
wherein the third total-reflection surface is concave between the second total-reflection surface and the convex portion, and
wherein the third total-reflection surface and the convex portion have surfaces curved in opposite directions to each other about the first inflection point.

15. The optical lens of claim 14, wherein the outer sidewall has a vertical surface from the edge of bottom surface and is located at a lower position than a bottom position of the recess portion.

16. The optical lens of claim 14, wherein the convex portion is provided more inward than the apex of the light exit surface.

17. The optical lens of claim 14, wherein the convex portion is provided more upward than the apex of the light exit surface,
wherein the convex portion has a curvature smaller than a curvature of the first concave curved surface, and
wherein the curvature of the convex portion is greater than a curvature of the third total-reflection surface.

18. The optical lens of claim 14, wherein an apex of the convex portion is the apex of the light exit surface, and
wherein a curvature of the convex portion is smaller than a curvature of the third total-reflection surface.

19. The optical lens of claim 14, wherein a depth of the recess portion is a range of 65% to 75% of a thickness of the optical lens, and
wherein a thickness of a central portion between the recess portion and the bottom surface is a range of 25% to 35% of a thickness of the optical lens.

20. The optical lens of claim 19, wherein a curvature of e first total-reflection surface is smaller than a curvature of the second total-reflection surface,
wherein the curvature of the first total-reflection surface is greater than the curvature of the third total-reflection surface, and
wherein a curvature of the convex portion is at least two times smaller than the curvature of the first total-reflection surface.

* * * * *